(12) United States Patent
Goto et al.

(10) Patent No.: US 10,768,657 B2
(45) Date of Patent: Sep. 8, 2020

(54) OPERATION DEVICE AND CONTROL METHOD THEREOF

(71) Applicant: ALPS ALPINE CO., LTD., Tokyo (JP)

(72) Inventors: Atsushi Goto, Miyagi (JP); Kazunari Takahashi, Miyagi (JP)

(73) Assignee: ALPS ALPINE CO., LTD., Tokyo (JP)

( * ) Notice: Subject to any disclaimer, the term of this patent is extended or adjusted under 35 U.S.C. 154(b) by 26 days.

(21) Appl. No.: 16/225,470

(22) Filed: Dec. 19, 2018

(65) Prior Publication Data
US 2019/0146546 A1 May 16, 2019

Related U.S. Application Data

(63) Continuation of application No. PCT/JP2017/008060, filed on Mar. 1, 2017.

(30) Foreign Application Priority Data

Jun. 27, 2016 (JP) .................. 2016-126476

(51) Int. Cl.
*G05G 5/03* (2008.04)
*G05G 1/08* (2006.01)
(Continued)

(52) U.S. Cl.
CPC .................. *G05G 5/03* (2013.01); *F16F 9/12* (2013.01); *F16F 9/53* (2013.01); *F16F 9/535* (2013.01);
(Continued)

(58) Field of Classification Search
CPC G05G 5/03; G05G 1/08; G05G 25/00; G05G 2505/00; F16F 9/12; F16F 9/53;
(Continued)

(56) References Cited

U.S. PATENT DOCUMENTS

| 6,373,465 B2 * | 4/2002 | Jolly ..................... B62D 5/006 244/223 |
| 6,710,565 B2 | 3/2004 | Maeda |

(Continued)

FOREIGN PATENT DOCUMENTS

| JP | H11-067017 | 3/1999 |
| JP | 2003-050639 | 2/2003 |

(Continued)

OTHER PUBLICATIONS

International Search Report dated May 16, 2017 in PCT/JP2017/008060 filed on Mar. 1, 2017.

*Primary Examiner* — Peter D McLoone
(74) *Attorney, Agent, or Firm* — IPUSA, PLLC

(57) ABSTRACT

An operation device includes an operation unit including an operation body worked by an operator's manipulation; a position detecting part detecting a position of the operation body; and a display unit displaying a position of the operation body. The display unit includes an operation member, a supporting body, and a movable load applying mechanism including a movable member, a magnetic generating mechanism, a magnetorheological fluid, and an operation controlling part. The display unit includes a display part displaying the operation position. A display controlling part PS controls a display. A controller is included to control the operation controlling part and the display controlling part. In a control method of the operation device, the controller controls to display a state of the operation position of the operation body on the display part.

8 Claims, 17 Drawing Sheets

(51) Int. Cl.
*F16F 9/53* (2006.01)
*H01L 43/06* (2006.01)
*G05G 25/00* (2006.01)
*G06F 3/01* (2006.01)
*G06F 3/0362* (2013.01)
*H01L 43/04* (2006.01)
*F16F 9/12* (2006.01)
*G08B 7/06* (2006.01)
*G09G 3/36* (2006.01)
*G08B 3/10* (2006.01)
*G08B 6/00* (2006.01)

(52) U.S. Cl.
CPC ............... *G05G 1/08* (2013.01); *G05G 25/00* (2013.01); *G06F 3/01* (2013.01); *G06F 3/016* (2013.01); *G06F 3/0362* (2013.01); *G08B 7/06* (2013.01); *G09G 3/36* (2013.01); *H01L 43/04* (2013.01); *H01L 43/06* (2013.01); *G05G 2505/00* (2013.01); *G08B 3/10* (2013.01); *G08B 6/00* (2013.01)

(58) Field of Classification Search
CPC .. F16F 9/535; G06F 3/04; G06F 3/016; G06F 3/0362; G08B 7/06; G08B 3/10; G08B 6/00; G09G 3/36; H01L 43/04; H01L 43/06
See application file for complete search history.

(56) References Cited

U.S. PATENT DOCUMENTS

| | | | |
|---|---|---|---|
| 6,854,573 B2 | 2/2005 | Jolly et al. | |
| 8,878,657 B2* | 11/2014 | Periquet | F16F 9/535 340/407.1 |
| 10,007,290 B2* | 6/2018 | Battlogg | A61F 2/38 |
| 10,330,195 B2* | 6/2019 | Yamanaka | F16H 59/08 |
| 10,481,631 B2* | 11/2019 | Battlogg | F16D 57/002 |
| 10,502,271 B2* | 12/2019 | Battlogg | F16C 33/6688 |
| 2001/0052893 A1* | 12/2001 | Jolly | B62D 5/006 345/156 |
| 2007/0279401 A1* | 12/2007 | Ramstein | G06F 3/0362 345/184 |
| 2011/0181405 A1 | 7/2011 | Periquet et al. | |
| 2016/0378131 A1* | 12/2016 | Battlogg | G05G 5/03 74/553 |
| 2018/0217628 A1* | 8/2018 | Battlogg | A61F 2/38 |
| 2018/0298959 A1* | 10/2018 | Battlogg | F16D 57/002 |
| 2018/0320750 A1* | 11/2018 | Takahashi | F16F 9/12 |
| 2018/0363725 A1* | 12/2018 | Yonehara | F16F 9/535 |
| 2018/0372216 A1* | 12/2018 | Yamanaka | G05G 5/03 |
| 2019/0286184 A1* | 9/2019 | Takahashi | G05G 5/03 |

FOREIGN PATENT DOCUMENTS

| | | |
|---|---|---|
| JP | 2005-507061 | 3/2005 |
| JP | 2010-134728 | 6/2010 |
| JP | 2011-519098 | 6/2011 |

* cited by examiner

OPERATION DEVICE AND CONTROL METHOD THEREOF

CROSS-REFERENCE TO RELATED APPLICATIONS

The present application is a continuation application of International Application No. PCT/JP2017/008060 filed on Mar. 1, 2017, which claims priority to Japanese Patent Application No. 2016-126476 filed on Jun. 27, 2016. The contents of these applications are incorporated herein by reference in their entirety.

BACKGROUND OF THE INVENTION

1. Field of the Invention

The present invention relates to an operation device and a control method thereof, which impart an operation feeling to an operator when manipulated by the operator.

2. Description of the Related Art

Recent years, various input devices have been proposed with a force feedback function, which makes operation feeling preferable and ensures a desired operation by applying external force (force sense) such as resistance force and thrust corresponding to an operation amount and an operation direction of an operation member when an operator manipulates the operation member. In particular, in an operation of an automotive control device such as an air conditioner, audio device, or a navigation device, a blind operation is often performed rather than an operation while viewing. Therefore, it is effective from a viewpoint of safety to apply force sense to the operation member (an operation knob).

A manual input device 800 for an automobile using such an input device is proposed in Patent Document 1 (Conventional Example 1). FIG. 16 is a diagram for explaining the manual input device 800 of the Conventional Example 1, and is a vertical cross-sectional view illustrating a main part of a basic configuration.

The manual input device 800 depicted in FIG. 16 includes a knob 880 (operation member) that is manually operated and rotated by a driver (operator), a planetary gearing mechanism including a carrier shaft 851 integrally provided with the knob 880, a ring gear housing 860 that is cylindrical and always fixes a ring gear 862 of the planetary gear mechanism, a motor 810 including an output shaft 811 engaged with a sun gear of the planetary gear mechanism, an encoder 830 (detecting part) for detecting the rotation of the output shaft 811 of the motor 810, and a control part that controls the rotation of the motor 810 according to a detection result of the encoder 830. The manual input device 800 rotates the motor 810 at a predetermined timing and transmits this rotational force to the knob 880 via the planetary gear mechanism so as to impart a predetermined operational feel to the operator.

This manual input device 800 is able to impart a preferable operation feeling; however, because the motor 810 is used, it is difficult to deal with a demand for further miniaturization. Accordingly, a method has been sought to impart the external force (force sense) such as the resistance force and the thrust corresponding to an operation amount and an operation direction of the operation member without using the motor 810.

In Patent Document 2 (Conventional Example 2), a manual brake 911 using a magnetic viscous fluid (magnetorheological fluid) is presented in which its own fluidity is influenced by magnetic field generating part. FIG. 17 is a diagram for explaining the manual brake 911 in the Conventional Example 2, and depicts a cross-sectional view in a longitudinal direction.

The manual brake 911 depicted in FIG. 17 includes a housing 913 that includes a first housing chamber 915 and a second housing chamber 917, a closing plate 919 for closing an open end side of the housing 913, a shaft 923 that penetrates the second housing chamber 917 and extends to the first housing chamber 915, a rotor 921 integrally provided at an end of the shaft 923 and juxtaposed in the first housing chamber, a magnetic field generator 929 that is provided in the first housing chamber 915 and is located immediately outside an outer periphery of the rotor 921, a magnetic field response material 941 that is provided in the first housing chamber 915 and is filled so as to surround the rotor 921, and a control part 925 that is provided in the second housing chamber 917 for controlling and monitoring a brake operation. Also, the magnetic field generator 929 includes a coil 931 and a pole piece 933 arranged so as to surround three sides of the coil 931.

In the manual brake 911 formed as described above, a magnetic flux J37 indicated by a broken line in FIG. 17 is generated when the coil 931 is energized, and as the magnetic flux J37 is generated, soft magnetic or magnetizable particles in the magnetic field response material 941 are arranged along the magnetic flux J37. For this reason, a resistance applied to the rotor 921 by the magnetic field responsive material 941 increases in a direction of cutting this array, that is, a rotating direction of the rotating rotor 921. Accordingly, the manual brake 911 has a braking effect of stopping the rotational motion of the shaft 923 by using the magnetic field response material 941 and the rotor 921.

Also, it is conceivable to use an action of the magnetic field responsive material 941 (magnetic viscous fluid) described above for the operation device; for example, an operation body (operation member) manipulated by the operator is engaged with the shaft 923 (rotating shaft), and a load is applied to the operation body (operation member) by controlling current flowing through the coil 931 by the control part 925. Thereby, it is possible to apply the external force (force sense) such as the resistance force and the thrust corresponding to the operation amount of the operation member and the operation direction without using the motor.

CITATION LIST

Patent Document

[Patent Document 1] Japanese Laid-open Patent Application No. 2003-50639
[Patent Document 2] Japanese Laid-open Patent Application No. 2005-507061

SUMMARY OF THE INVENTION

Technical Problem

By utilizing the action of the magnetic field responsive material 941 (magnetic viscous fluid) described above, it is possible to apply the external force (force sense) such as the resistance force and the thrust corresponding to the operation amount and the operation direction of the operation member without using a motor. Then, it is conceivable to apply a method of imparting this external force (force sense) to the input device as in Conventional Example 1.

However, in the configuration of Conventional Example 2, there is a case where the timing of input and the operation feeling are misaligned merely by applying the external force (force sense) such as the resistance force or the thrust corresponding to the operation amount and the operation direction of the operation member. In particular, in an operation device having a display section for displaying an operation position of the operation member, an position of an operation actually located on the operation member is a display position displayed on the display section, and the position of the operation desired by the operator and the display position do not coincide with each other. Due to this inconsistency, there is a problem that the operator feels uncomfortable.

The present invention has been made in view of the above, and an object of the present invention is to provide an operation device capable of imparting a preferable operational feel to an operator by using a magnetic viscous fluid when manipulated by the operator, and a control method of the operation device.

Solution to Problem

A first aspect of the present invention relates to an operation device includes an operation unit including an operation body worked by a manipulation of an operator; a position detecting part that detects a position of an operation where the operation body is located; and a display unit that displays an operation position of the operation body, wherein the operation unit includes an operation member that includes an operation member manipulated by the operator and having the operation body, a support body that freely supports the operation of the operation body, and a movable load applying mechanism that applies a load to the operation body, in which the operation body includes a movable shaft enabling the operation, wherein the movable load applying mechanism includes a movable member that operates in engagement with the movable shaft, a magnetic generating mechanism that sandwiches the movable member and a gap, and faces one side thereof, and a magnetic viscous fluid that exists in at least a part of the gap and whose viscosity changes according to a strength of a magnetic field, and an operation controlling part that controls the magnetic generation mechanism, wherein the magnetic generation mechanism includes a coil that generates a magnetic field by energization by the operation controlling part, and a first yoke that is provided so as to surround the coil and is disposed on one side of the movable member, wherein the display unit includes a display part that displays the operation position, and a display controlling part that controls a display on the display part, and a controller that controls the controls the operation controlling part and the display controlling part.

A second aspect of the present invention relates to a control method of an operation device including an operation unit including an operation body worked by a manipulation of an operator; a position detecting part that detects a position of the manipulation where the operation body is located; a display unit that displays an operation position of the operation body; and a controller that controls the operation controlling part and the display controlling part, wherein the operation unit includes an operation member that includes an operation member manipulated by the operator and having the operation body, a support body that freely supports the operation of the operation body, and a movable load applying mechanism that applies a load to the operation body, in which the operation body includes a movable shaft enabling the operation, wherein the movable load applying mechanism includes a movable member that operates in engagement with the movable shaft, a magnetic generating mechanism that sandwiches the movable member and a gap, and faces one side thereof, and a magnetic viscous fluid that exists in at least a part of the gap and whose viscosity changes according to a strength of a magnetic field, and an operation controlling part that controls the magnetic generation mechanism, wherein the magnetic generation mechanism includes a coil that generates a magnetic field by energization by the operation controlling part, and a first yoke that is provided so as to surround the coil and is disposed on one side of the movable member, wherein the display unit includes a display part that displays the operation position, and a display controlling part that controls a display on the display part, the control method is characterized by forming, by the operation controlling part, a load curve having a plurality of peak values and a plurality of bottom values of the load by a strength of a current value to the coil, and controlling, by the controller, the display controlling part to display, on the display part, a shift state of the operation position in a case of shifting from a first peak value to a first bottom value and from the first bottom value to a next second peak value among the plurality of peak values and the plurality of bottom values.

BRIEF DESCRIPTION OF THE DRAWINGS

FIG. 8B is omitted.

DETAILED DESCRIPTION OF THE PREFERRED EMBODIMENTS

In the following, embodiments will be described with reference to the accompanying drawings.

First Embodiment

Figure 1:
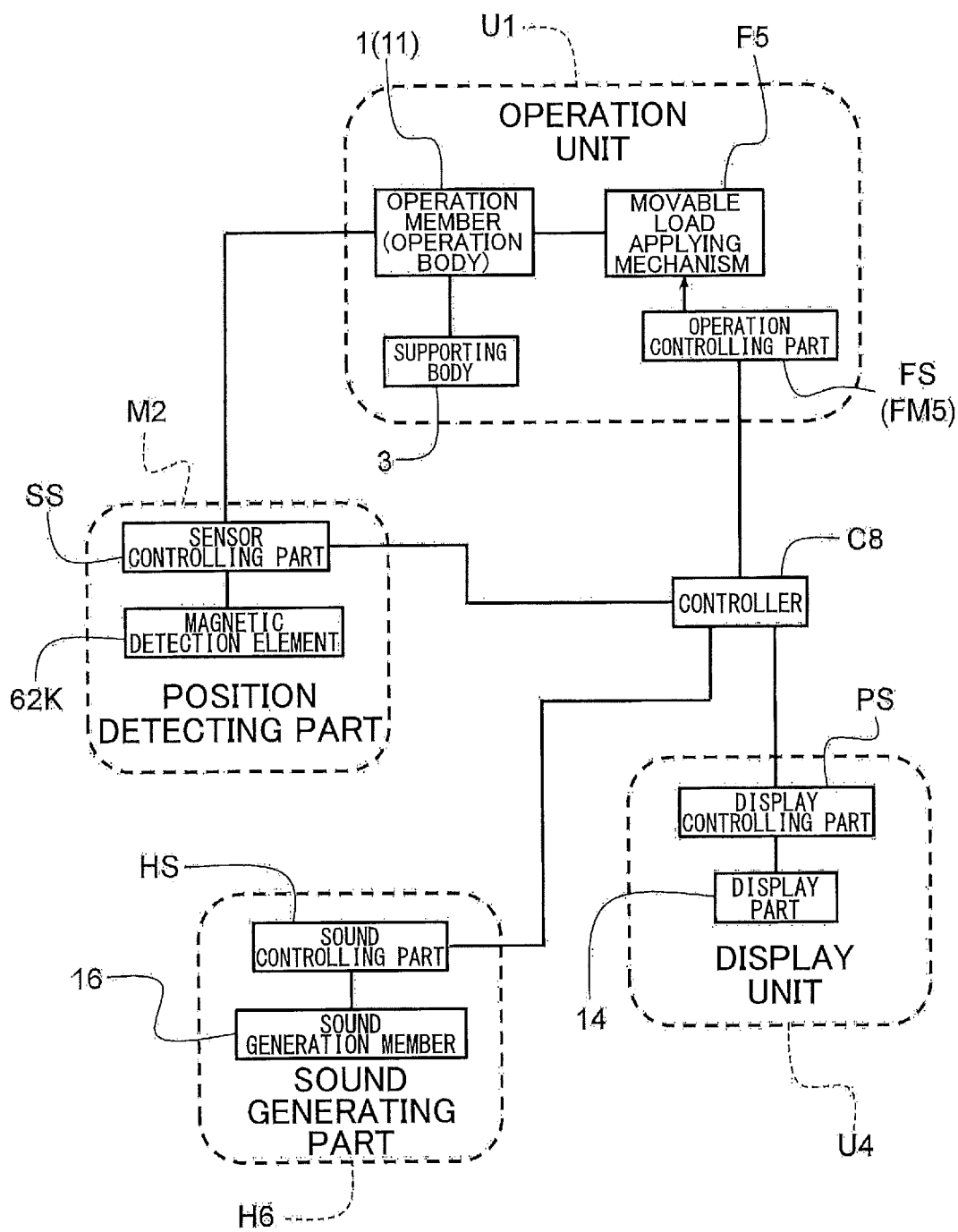
FIG. 1 is a diagram for explaining an operation device according to a first embodiment, and is a block diagram illustrating a configuration of the operation device.

FIG. 1 is a block diagram illustrating a configuration of an operation device 100 according to a first embodiment.

As illustrated in FIG. 1, the operation device 100 of the first embodiment includes an operation unit U1 having an operation body 11 operated by a manipulation of an operator, a position detecting part M2 for detecting a position of the operation body 11, a display unit U4 (refer to FIG. 14 to be described later) for displaying an operation position PP viewed by the operator, a sound generating part (not depicted in other figures, but denoted by H6 in the block diagram of FIG. 1) having a sound generating member (not depicted in other figures, but denoted by 16 in the block diagram of FIG. 1) for generating an electronic sound, and a controller (not depicted in other figures, but denoted by C8 in the block diagram of FIG. 1) electrically connected to each of the operation unit U1, the position detecting part M2, the display unit U4, and the sound generating part (H6). In the first embodiment, in the operation device 100, the position detecting part M2 is disposed in a vicinity of the operation unit U1 manipulated by the operator, the position detecting part M2 and the display unit U4 are connected to each other so that the position at which the operation body 11 is operated is displayed on the display unit U4 at a position distant from the operation unit U1.

Next, each of configuration requirements of the operation device 100 will be described in detail.

Figure 2:
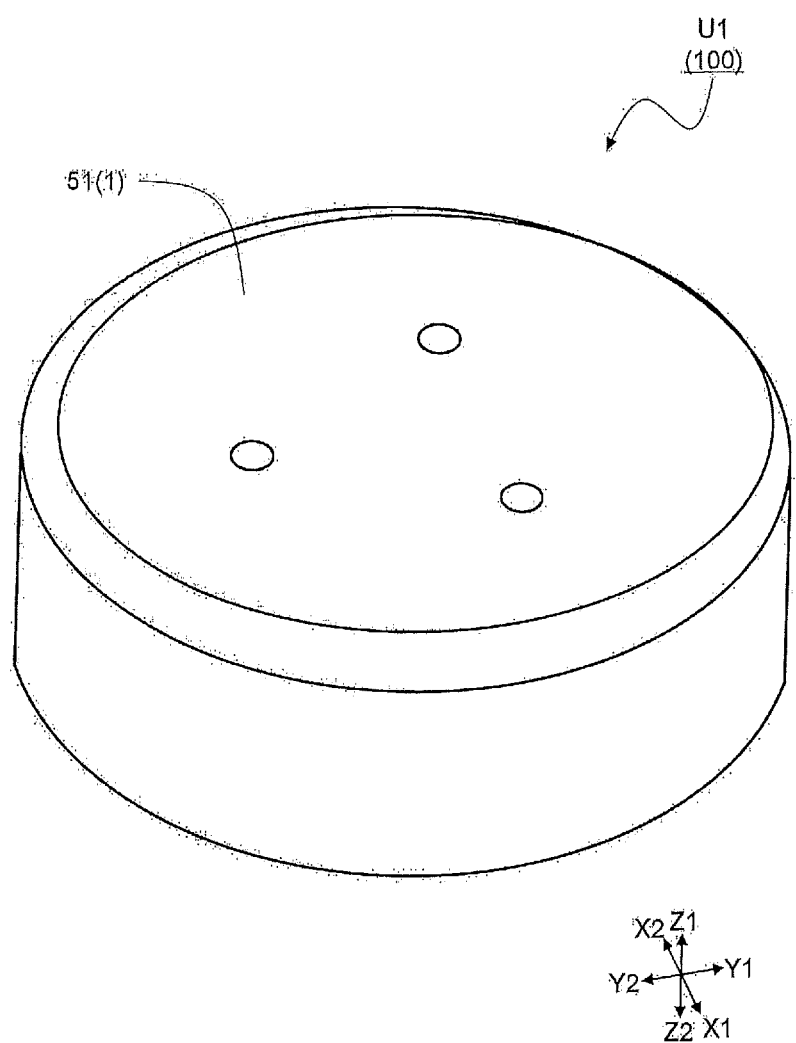
FIG. 2 is a diagram for explaining the operation device according to the first embodiment, and is an upper perspective view of an operation unit.
Figure 3A:
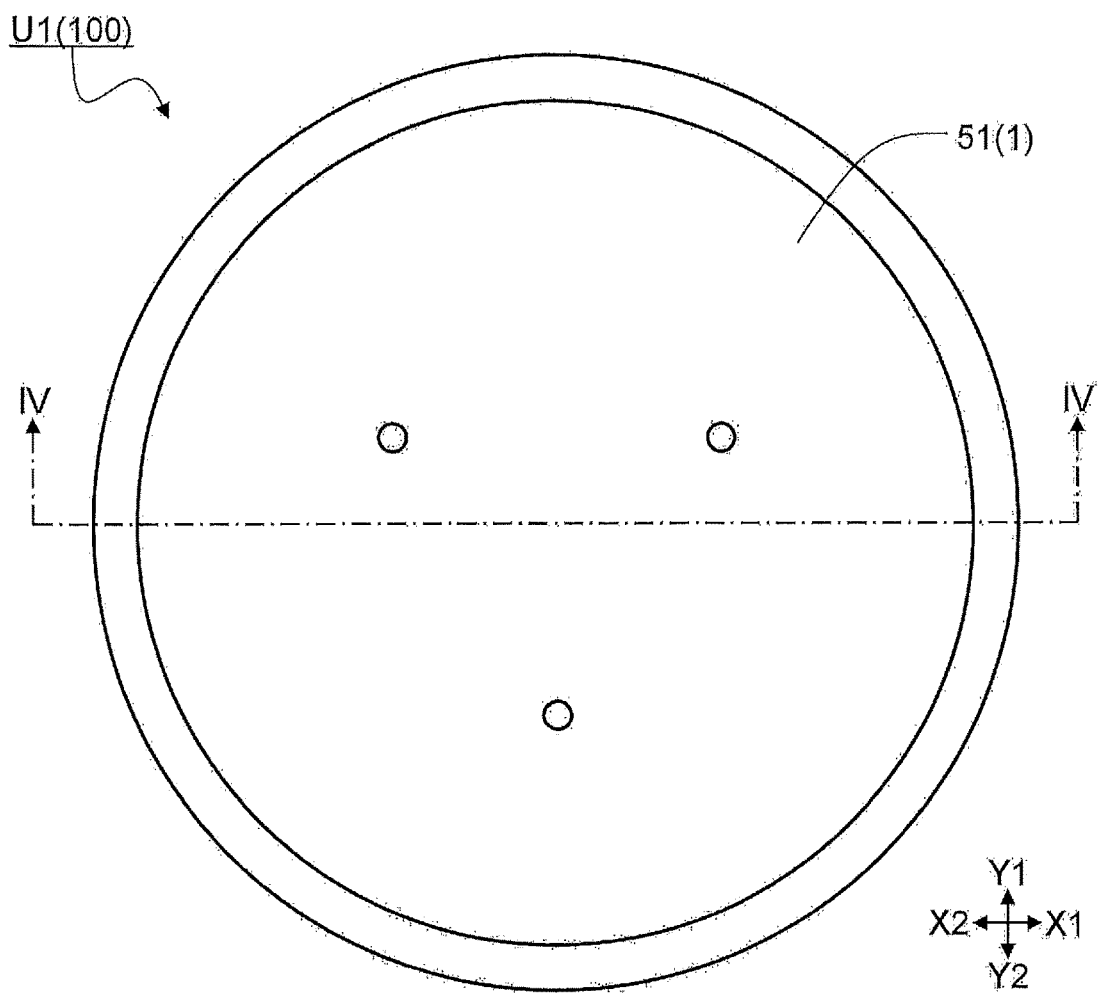
FIG. 3A is a top view of the operation unit viewed from a Z1 side depicted in FIG. 2.
Figure 3B:
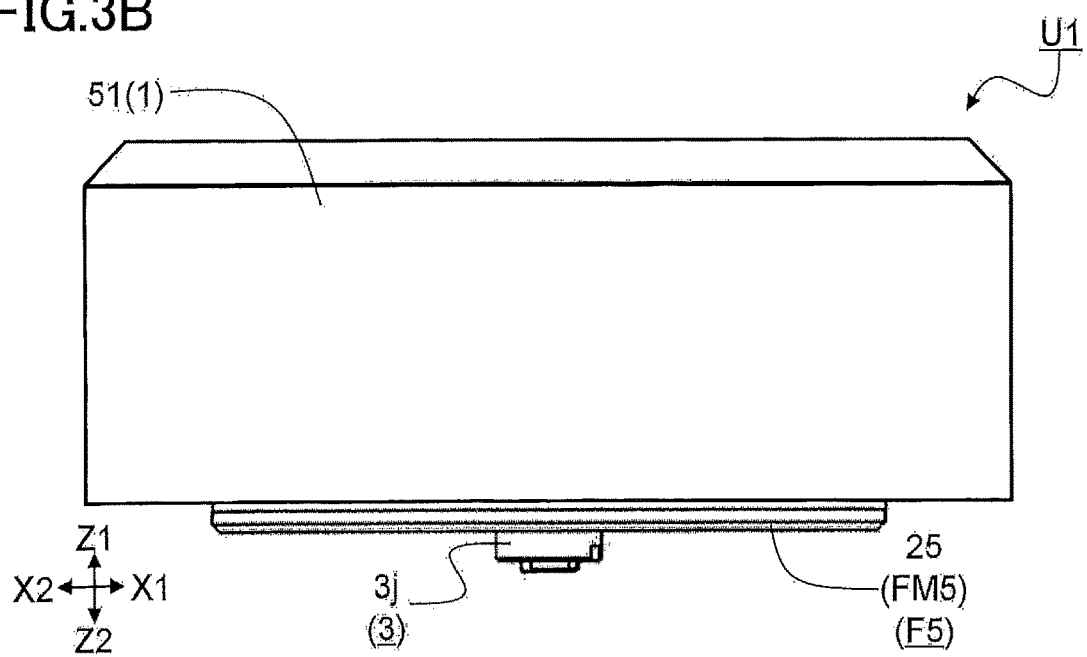
FIG. 3B is a front view of the operation unit viewed from a Y2 side depicted in FIG. 2.
Figure 4:
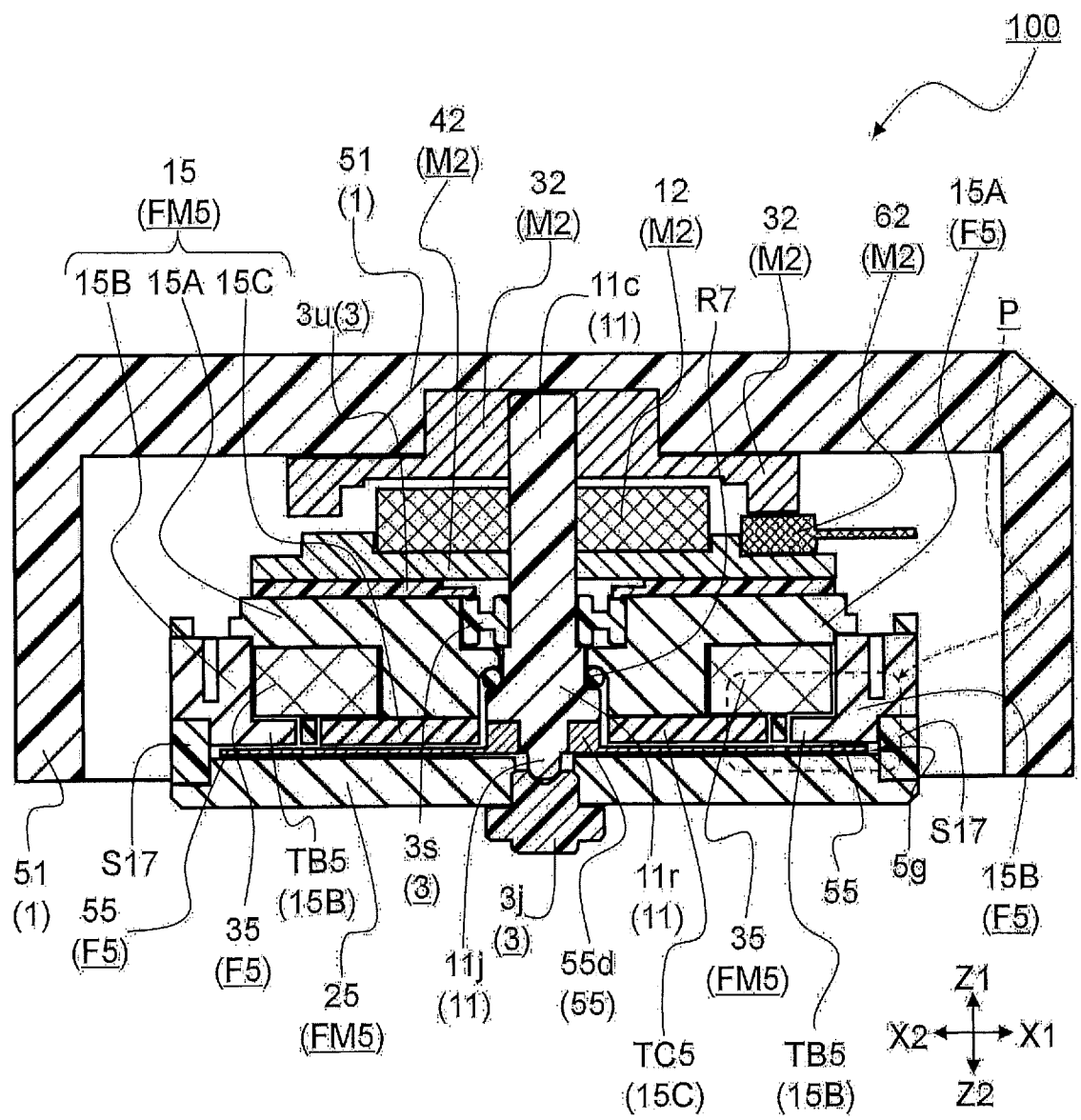
FIG. 4 is a diagram for explaining the operation device according to the first embodiment, and is a cross-sectional view taken along a line IV-IV depicted in FIG. 3A.
Figure 5:
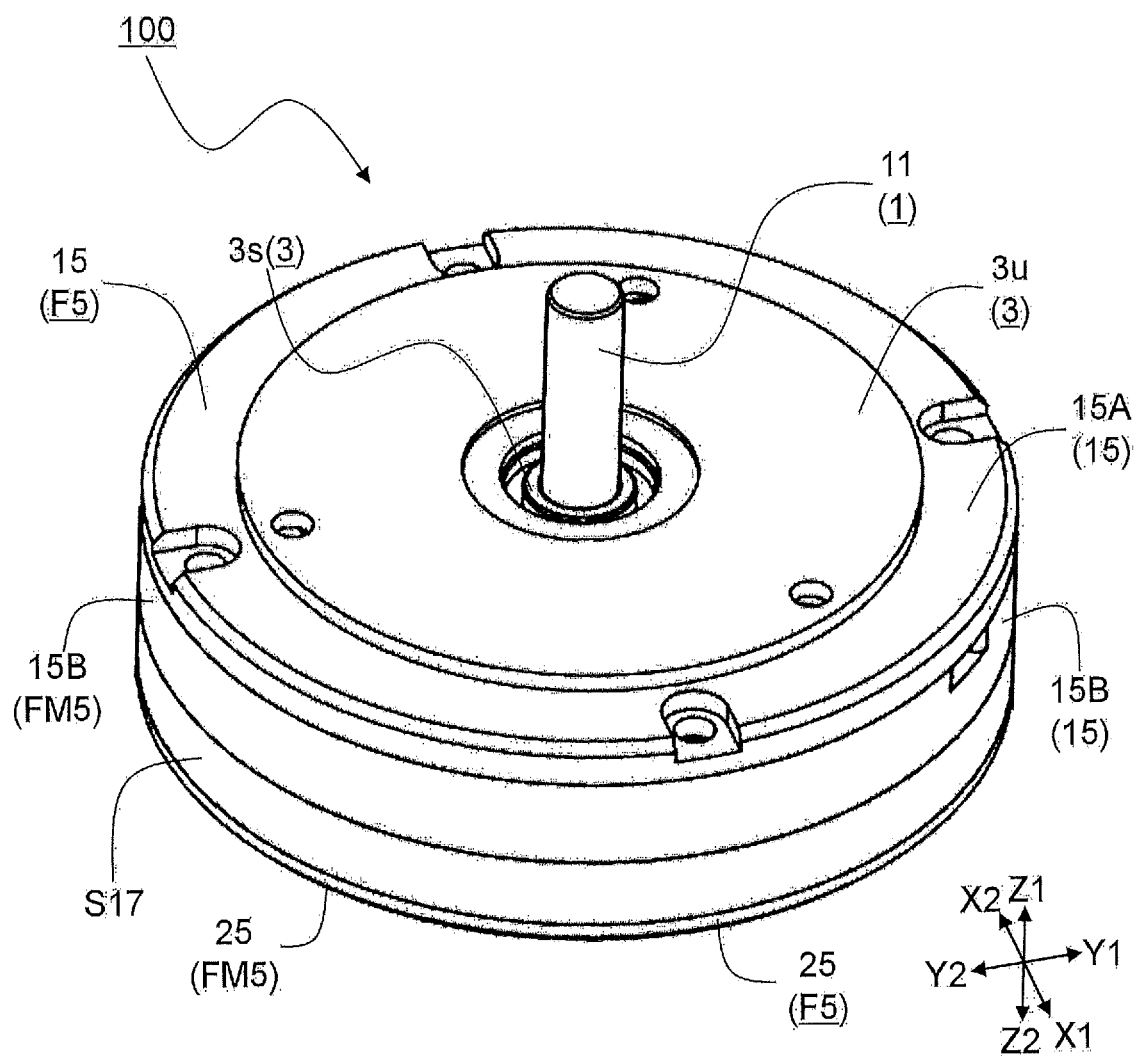
FIG. 5 is a diagram for explaining an operation unit of the operation device according to the first embodiment, and is an upper perspective view of the operation member depicted in FIG. 2, omitting an operation portion.
Figure 6:
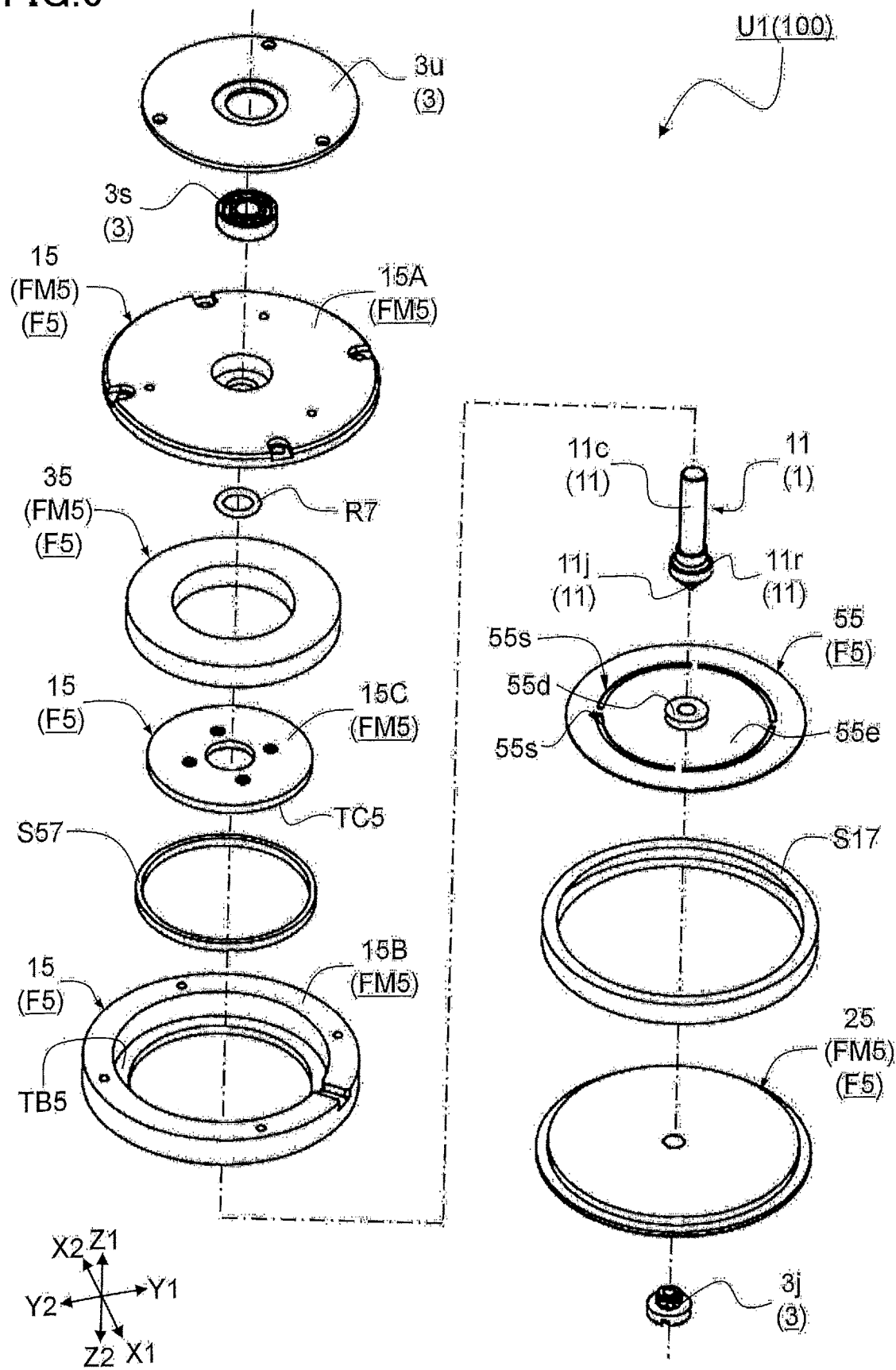
FIG. 6 is a diagram for explaining the operation unit of the operation device according to the first embodiment, and is an exploded perspective view of the operation unit depicted in FIG. 5.

First, the operation unit U1 of the operation device 100 will be described. FIG. 2 is an upper perspective view of the operation unit U1. FIG. 3A is a top view of the operation unit U1 as viewed from a Z1 side depicted in FIG. 2, and FIG. 3B is a front view of the operation unit U1 as viewed from a Y2 side depicted in FIG. 2. FIG. 4 is a cross-sectional view taken along line IV-IV in FIG. 3A. FIG. 5 is an upper perspective view in which an operation section 51 of the operation member 1 depicted in FIG. 2. FIG. 6 is an exploded perspective view of the operation unit U1 depicted in FIG. 5.

The operation unit U1 of the operation device 100 has an appearance as depicted in FIG. 2, FIG. 3A, FIG. 3B, and FIG. 5, and as illustrated in FIG. 6, mainly includes an operation member 1 having an operation body 11 that moves in an operation direction by the manipulation of the operator, a support body 3 that freely supports the operation of the operation body 11, and a movable load applying mechanism F5 for applying a load to the operation body 11. The operation device 100 of the first embodiment is a rotary type device capable of being operated in a turning direction (rotation direction) with a movable shaft 11j (refer to FIG. 4 to be described later) of the operation body 11 of the operation unit U1 being set as a rotation center.

Also, as well as the above described components, as illustrated in FIG. 4 and FIG. 6, the operation unit U1 of the first embodiment includes sidewall spacers S17 forming a part of a side wall of a main body (refer to FIG. 4), and a slit spacer S57 (refer to FIG. 6, FIG. 7, and FIG. 9B) disposed in the movable load applying mechanism F5. In this rotary operation unit U1, the operation section 51 of the operation member 1 depicted in FIG. 2 FIG. 3A, and FIG. 3B is engaged with one end side of the operation body 11, the operation section 51 is gripped and manipulated by the operator, and the operation body 11 rotates in both directions.

First, the operation member 1 of the operation unit U1 will be described. The operation member 1 includes the operation section 51 held by an operator, and the operation body 11 engaged with the operation section 51 and operating in accordance with a rotation operation of the operation section 51.

The operation section 51 of the operation member 1 is a member such as an operation knob, an operational finger grip, or the like, which is grasped and manipulated by the operator, and is formed of a synthetic resin such as polybutylene terephthalate resin (PBT, poly butylene terephthalate) or the like in a cylindrical shape in a box shape as depicted in FIG. 2, FIG. 3A, and FIG. 3B in the first embodiment. Moreover, as depicted FIG. 4, the operation section 51 is engaged with one end side of the operation body 11. The shape thereof may be arbitrarily determined depending on an applied product in consideration of a shape and the like to be easily operated.

The operation body 11 of the operation member 1 is formed of a synthetic resin such as polybutylene terephthalate resin (PBT) or the like, and includes, as depicted in FIG. 6, a pillar section 11c being cylindrical, the movable shaft 11j penetrating a center of the pillar section 11c and having a center at a rotation center, and a ring section 11r provided on another end side of the operation body 11 and having a size slightly larger than the pillar section 11c, which are manufactured by integrally injection molding. Moreover, as depicted in FIG. 4, an O-ring R7 is inserted through the pillar section 11c and is disposed at a joint between the pillar section 11c and the ring section 11r. The O-ring R7 mounted here also has a function of closing an accommodating space, in which a movable member 55 described later is housed. This configuration prevents a magnetic viscous fluid 75 filled in the accommodation space from leaking out from the accommodation space.

Next, the support body 3 of the operation unit U1 will be described. As described in FIG. 4, the support body 3 is mainly formed by a bearing section 3j to which an end portion of the movable shaft 11*j* of the operation body 11 is abutted, a shaft supporting section 3*s* through which the pillar section 11*c* of the operation body 11 is inserted to guide the pillar section 11*c*, and a lid section 3*u* for holding and stabilizing the shaft supporting section 3*s*. The support body 3 supports the operation body 11 (the operation member 1) so that the operation body 11 is able to freely move (rotate).

Moreover, as illustrated in FIG. 4, the bearing section 3*j* of the support body 3 has a recessed shape on a side facing the movable shaft 11*j* of the operation body 11. When the operation unit U1 is assembled, the bearing section 3*j* allows the end portion of the movable shaft 11*j* to abut against the recessed portion of the bearing section 3*j* so as to allow an easy operation of the operation body 11.

Furthermore, the shaft supporting section 3*s* of the support body 3 has a ring shape having a through hole in the center portion (refer to FIG. 6), and is accommodated in a recessed portion 15*u* (refer to FIG. 8A described later) provided in the upper portion of a center of the movable load applying mechanism F5 (an upper yoke 15A of a first yoke 15 of the magnetic generating mechanism FM5) as depicted in FIG. 4. Also, the pillar section 11*c* of the operation body 11 is inserted through the through hole of the shaft supporting section 3*s*, and the shaft supporting section 3*s* rotatably supports the pillar section 11*c* (operation body 11).

Moreover, the lid section 3*u* of the support body 3 has a circular plate shape with a through hole at the center in a flat plate shape (refer to FIG. 6), and is placed on the movable load applying mechanism F5 (the upper yoke 15A) as illustrated in FIG. 5. Also, similar to the shaft supporting section 3*s*, the pillar section 11*c* of the operation body 11 is inserted through the through hole of the lid section 3*u*. The bearing section 3*j*, the shaft supporting section 3*s*, and the lid section 3*u* are manufactured by injection molding using a synthetic resin such as polybutylene terephthalate resin (PBT) similarly to the operation body 11.

Figure 7:
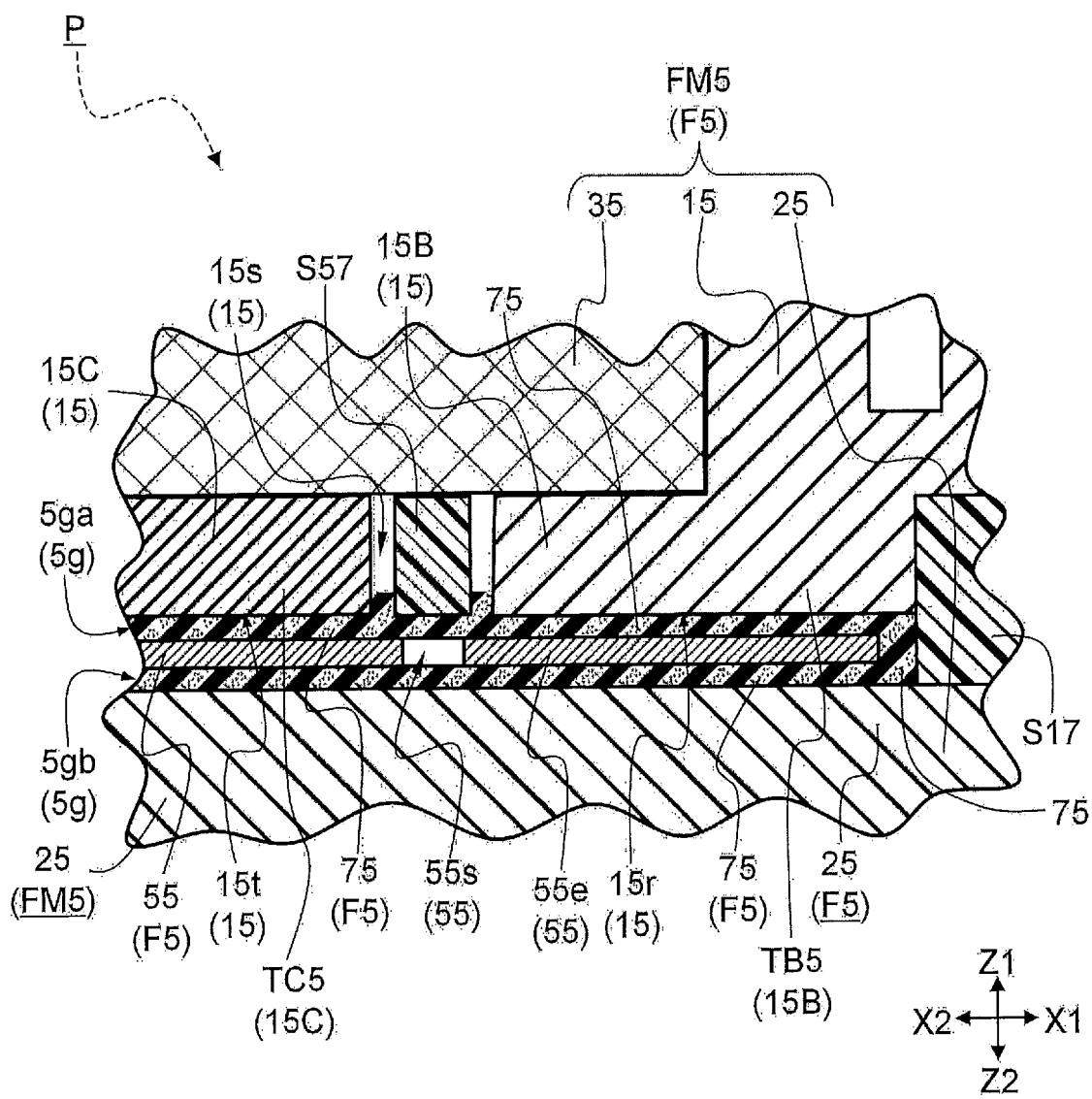
FIG. 7 is a diagram for explaining a movable load applying mechanism of the operation device according to the first embodiment, and is an enlarged sectional view of a portion P depicted in FIG. 4.
Figure 8A:
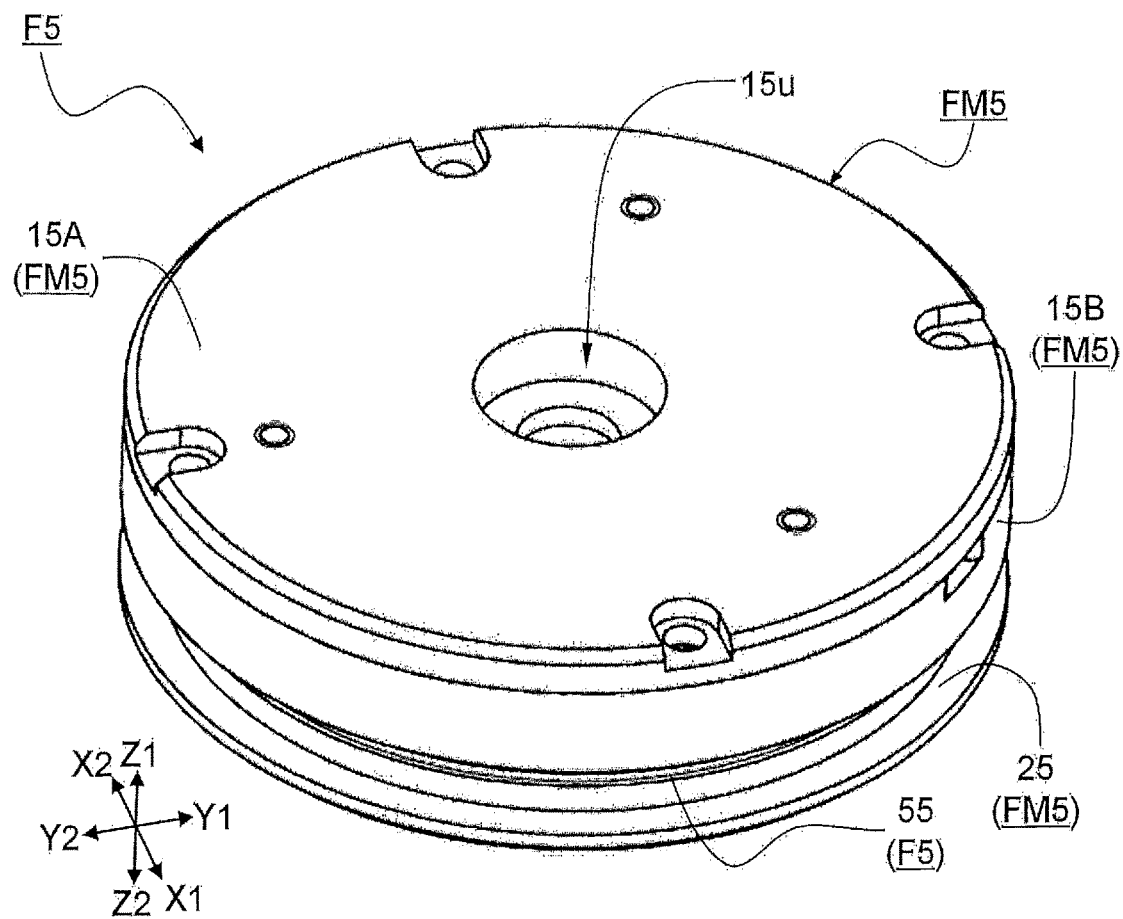
FIG. 8A is an upper perspective view of the movable load applying mechanism.
Figure 8B:
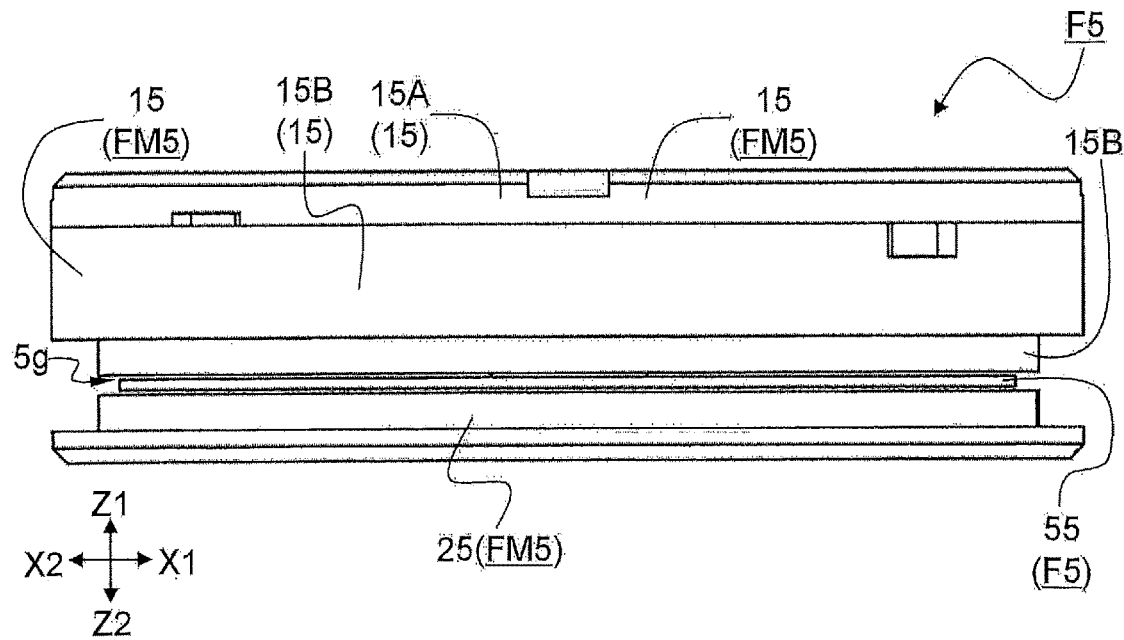
FIG. 8B is a front view seen from a Y2 side depicted in FIG. 8A.
Figure 9A:
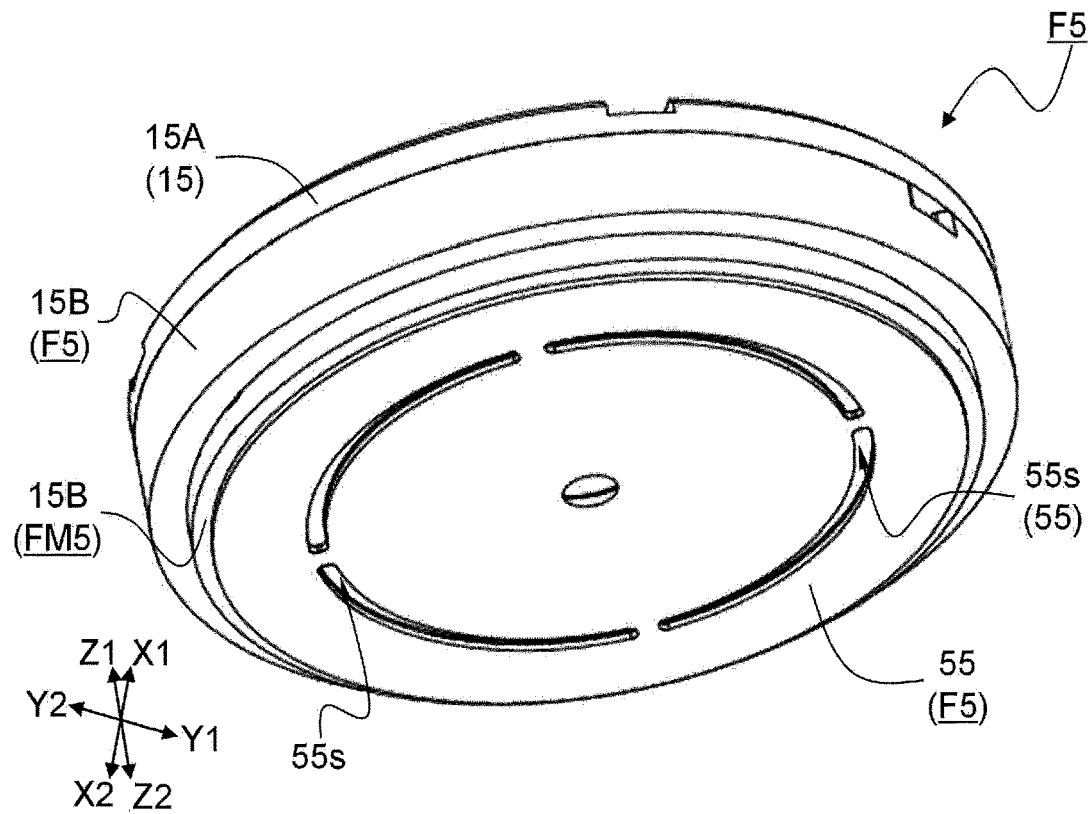
FIG. 9A is a bottom perspective view, in which a second yoke depicted in FIG. 8A
Figure 9B:
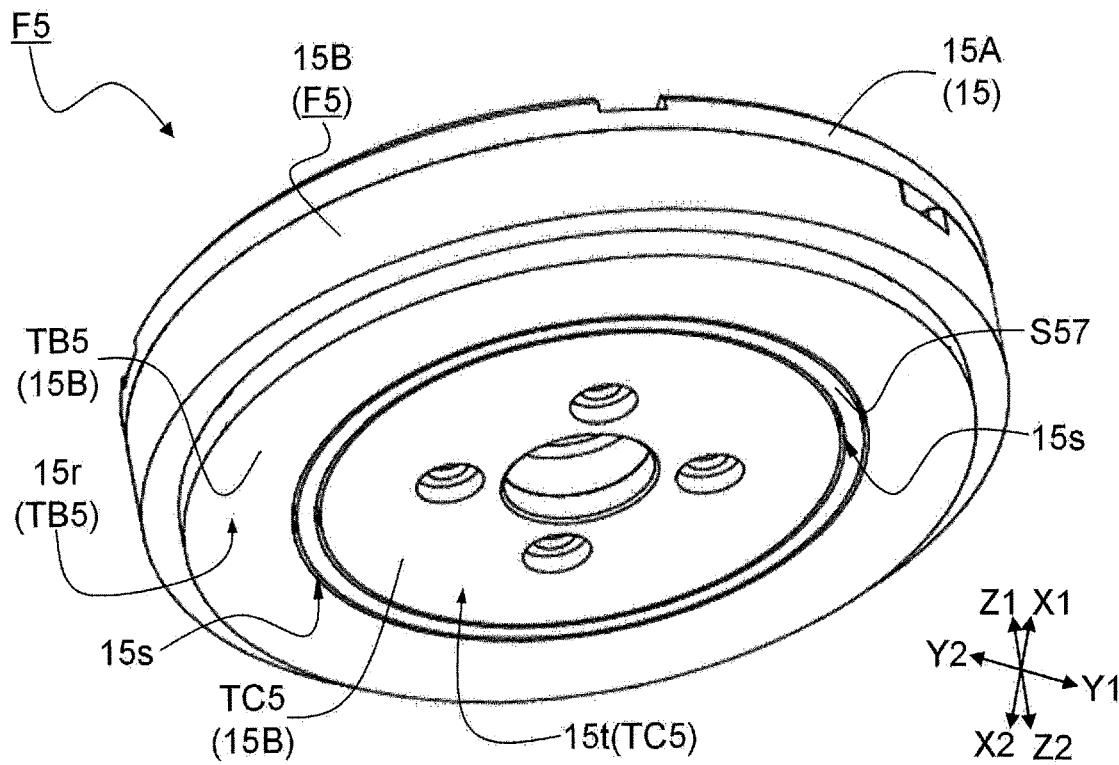
FIG. 9B is a lower perspective view, in which the movable member depicted in FIG. 9A is further omitted.

Next, the movable load applying mechanism F5 of the operation unit U1 will be described. FIG. 7 is an enlarged sectional view of a portion P depicted in FIG. 4. FIG. 8A is an upper perspective view of the movable load applying mechanism F5, and FIG. 8B is a front view seen from a Y2 side depicted in FIG. 8A. FIG. 9A is a lower perspective view, in which a second yoke 25 depicted in FIG. 8A is omitted, and FIG. 9B is a lower perspective view, in which the movable member 55 depicted in FIG. 9A is further omitted.

The movable load applying mechanism F5 is formed to include a movable member 55 that operates in engagement with the movable shaft 11*j* as illustrated in FIG. 4, the magnetic generating mechanism FM5 sandwiching the movable member 55 and a gap 5*g* and facing one side thereof, and the magnetic viscous fluid 75 existing in the gap 5*g* as illustrated in FIG. 7.

Furthermore, the magnetic generating mechanism FM5 of the movable load applying mechanism F5 has a cylindrical shape as depicted in FIG. 8A, and is formed as depicted in FIG. 4 to include a coil 35 for generating a magnetic field by energization, the first yoke 15 provided so as to surround the coil 35, the second yoke 25 opposed to the other side across the gap 5*g* from the movable member 55, and an operation controlling part (not depicted in other figures, but denoted by FS in FIG. 1) for controlling energization to the coil 35.

The movable load applying mechanism F5 receives a rotational operation by the operator, and is formed to apply a load from the movable load applying mechanism F5 to the operation body 11 so as to apply a load (rotational load) to the operation section 51 (operation knob, an operational finger grip, or the like) of the operation member 1 to the operator.

First, the magnetic generating mechanism FM5 of the movable load applying mechanism F5 will be described. The coil 35 of the magnetic generating mechanism FM5 is formed by winding a metal wire rod in an annular shape, and is disposed on one side (on a Z1 side illustrated in FIG. 4) of the movable member 55 as depicted in FIG. 4. By energizing the coil 35, a magnetic field is generated around the coil 35. The coil 35 has a shape, in which a metal wire material is wound and bundled; however, in FIG. 6, the coil 35 is simplified and depicted as a flat surface.

Next, as depicted in FIG. 4, the first yoke 15 of the magnetic generating mechanism FM5 is provided so as to surround the coil 35 and has the upper yoke 15A that covers one side (Z1 side depicted in FIG. 4) of the coil 35 and an inner side wall (side wall on an center side of the annular shape) of the coil 35, a lateral yoke 15B covering the outer side wall of the coil 35 and a part of the other side (Z2 side in FIG. 4) of the coil 35, and a lower yoke 15C covering a part of the other side of the coil 35.

As depicted in FIG. 4, the first yoke 15 is disposed on one side of the movable member 55, and a part of the lateral yoke 15B and the lower yoke 15C are opposed to the movable member 55 across the gap 5*g* (refer to a first gap 5*ga* in FIG. 7). A magnetic flux generated from the coil 35 is confined by the first yoke 15, and a magnetic field acts efficiently on the movable member 55 side.

Moreover, as depicted in FIG. 7 and FIG. 9B, the first yoke 15 has a slit 15*s* (yoke slit) formed by the lateral yoke 15B and the lower yoke 15C on the side facing the movable member 55, and has a shape, in which the side of the first yoke 15 facing the movable member 55 is divided. The portion of the lateral yoke 15B facing the movable member 55 is set as a first facing portion TB5 of the first yoke 15 and a portion of the lower yoke 15C facing the movable member 55 is set as a second facing portion TC5.

Also, as depicted in FIG. 4 and FIG. 7, a width of the slit 15*s* is narrower than the gap 5*g* (the first gap 5*ga*) between the first yoke 15 and the movable member 55. As a result, a magnetic field is generated by energizing the coil 35, and the magnetic path is formed such that the magnetic path extends from the first facing portion TB5 of the first yoke 15 to the second facing portion TC5 toward the movable member 55, for example.

Moreover, in the first embodiment, as depicted FIG. 9B, the slit spacer S57 (refer to FIG. 6) having the ring shape is accommodated in a portion of the slit 15*s* of the first yoke 15. The slit spacer S57 is formed using a synthetic resin such as polybutylene terephthalate resin (PBT), and the slit spacer S57 divides the first facing portion TB5 of the first yoke 15 (lateral yoke 15B) and the second facing portion TC5 of the first yoke 15 (lower yoke 15C) also in the magnetic circuit. In the first embodiment, the first yoke 15 is formed by three components: an upper yoke 15A, a lateral yoke 15B, and a lower yoke 15C. However, the first yoke 15 is not limited to this configuration, and may be formed by two components or four or more components. The slit 15*s* is preferably used for the first yoke 15; however, the first yoke 15 may not include the slit 15*s*.

Next, the second yoke 25 of the magnetic generating mechanism FM5 is formed in a disk shape as depicted in FIG. 6, and is disposed on the other side of the movable member 55 sandwiching the movable member 55 and the gap 5*g* (second gap 5*gb*) and facing one side thereof as depicted in FIG. 4, FIG. 7, and FIG. 8B. Whereby, the magnetic flux generated from the coil 35 surely penetrates from the first facing portion TB5 of the first yoke 15 to the second yoke 25 and from the second yoke 25 to the second facing portion TC5 of the first yoke 15. Therefore, a magnetic path is reliably formed in a direction (direction crossing the X-Y plane depicted in FIG. 8A) in which the movable member 55 operates and in a direction perpendicular to the movable member 55 (Z direction perpendicular to the X-Y plane depicted in FIG. 8B).

Also, between an outer circumference side of the first yoke 15 (lateral yoke 15B) and an outer circumference side of the second yoke 25, the sidewall spacer S17 forming a part of a side wall of the main body is provided. The sidewall spacer S17 is also formed using a synthetic resin such as polybutylene terephthalate resin (PBT), and divides the first yoke 15 (lateral yoke 15B) and the second yoke 25 in a magnetic circuit.

Moreover, as depicted in FIG. 4, by the first yoke 15, the second yoke 25, and the sidewall spacer S17, a narrow accommodation space is formed in a direction (X-Y plane direction) perpendicular to a direction (Z direction illustrated in FIG. 4) along the movable shaft 11j of the operation body 11. The movable member 55 of the movable load applying mechanism F5 is disposed in this narrow accommodating space.

Next, the operation controlling part (FS) of the magnetic generation mechanism FM5 uses an integrated circuit (IC, integrated circuit), and controls the amount of current to be supplied to the coil 35, timing of energization, and the like. More specifically, for example, when a rotation operation is performed by an operator's manipulation, upon receiving a detection signal from a position detecting part M2, which detects the position of the operation body 11, the operation controlling part (FS) causes a certain amount of current to flow in the coil 35 or changes an amount of current according to the position of the operation body 11.

Furthermore, the operation controlling part (FS) is mounted on a circuit board (not depicted) and is electrically connected to the coil 35. The operation controlling part (FS) and the circuit board are suitably arranged, but are not limited, in a vicinity of the magnetic generating mechanism FM5. For instance, the operation controlling part (FS) may be connected to the coil 35 by a flexible printed circuit board (FPC, Flexible printed circuits) or the like, and may be mounted on a mother board (motherboard) of a product to be applied.

Next, the movable member 55 of the movable load applying mechanism F5 will be described. As depicted in FIG. 6, the movable member 55 is formed by a base section 55d having a through hole centered on the rotation center of the movable shaft 11j, and a disc section 55e having a disk-shape and formed integrally with the base section 55d and centered on the rotation center.

In addition, the movable member 55 is formed of a soft magnetic material such as iron. As a result, a magnetic path is reliably formed from the first yoke 15 to the movable member 55 and from the movable member 55 to the first yoke 15. That is, a magnetic path is reliably formed in a direction perpendicular to the direction in which the movable member 55 operates.

As depicted in FIG. 4, the base section 55d of the movable member 55 is engaged with the movable shaft 11j of the operation body 11 on the lower side of the ring portion 11r of the operation body 11. As a result, as the operation body 11 rotates in any one of both directions, the disc section 55e of the movable member 55 rotates in that of the directions.

When the operation device 100 is assembled, the disc section 55e of the movable member 55 is accommodated in the narrow accommodating space as illustrated in FIG. 4. As a result, a magnetic flux generated from the coil 35 surely penetrates from the first facing portion TB5 of the first yoke 15 to the movable member 55, from the movable member 55 to the second yoke 25, from the second yoke 25 to the movable member 55, and from the movable member 55 to the second facing portion TC5 of the first yoke 15. Therefore, a magnetic path is reliably formed by the direction perpendicular to a moving direction of the movable member 55.

Also, as depicted in FIG. 6 and FIG. 9A, a movable section slit 55s, which has an arc-shape and formed by dividing a virtual ring shape centered on the rotation center of the movable shaft 11j into four portions, is formed in the disk section 55e. As depicted in FIG. 4 and FIG. 7, the movable section slit 55s is provided at a position facing to the slit 15s provided in the first yoke 15. Whereby, a magnetic flux generated from the coil 35 is not confined by the movable member 55, and is able to reliably penetrate the second yoke 25 via the first yoke 15 and the movable member 55, and from the second yoke 25 to the first yoke 15 via the movable member 55.

By this configuration, it is possible to reduce the magnetic flux, which is not guided from the first yoke 15 to the second yoke 25 but shortcuts so as to pass only magnetic viscous fluid 75 at an upper side and the movable member 55 to be guided to the first yoke 15 (from the lateral yoke 15B to the lower yoke 15C without passing through the second yoke 25).

In addition, as illustrated in FIG. 7, because a width of the movable section slit 55s is smaller than a width of the slit 15s of the first yoke 15, it is possible for the movable member 55 to catch a spread of the magnetic flux from the first yoke 15 and to guide to the second yoke 25. It is more preferable that the center position of the width of the movable section slit 55s and the center position of the width of the slit 15s coincide with each other.

Figure 10A:
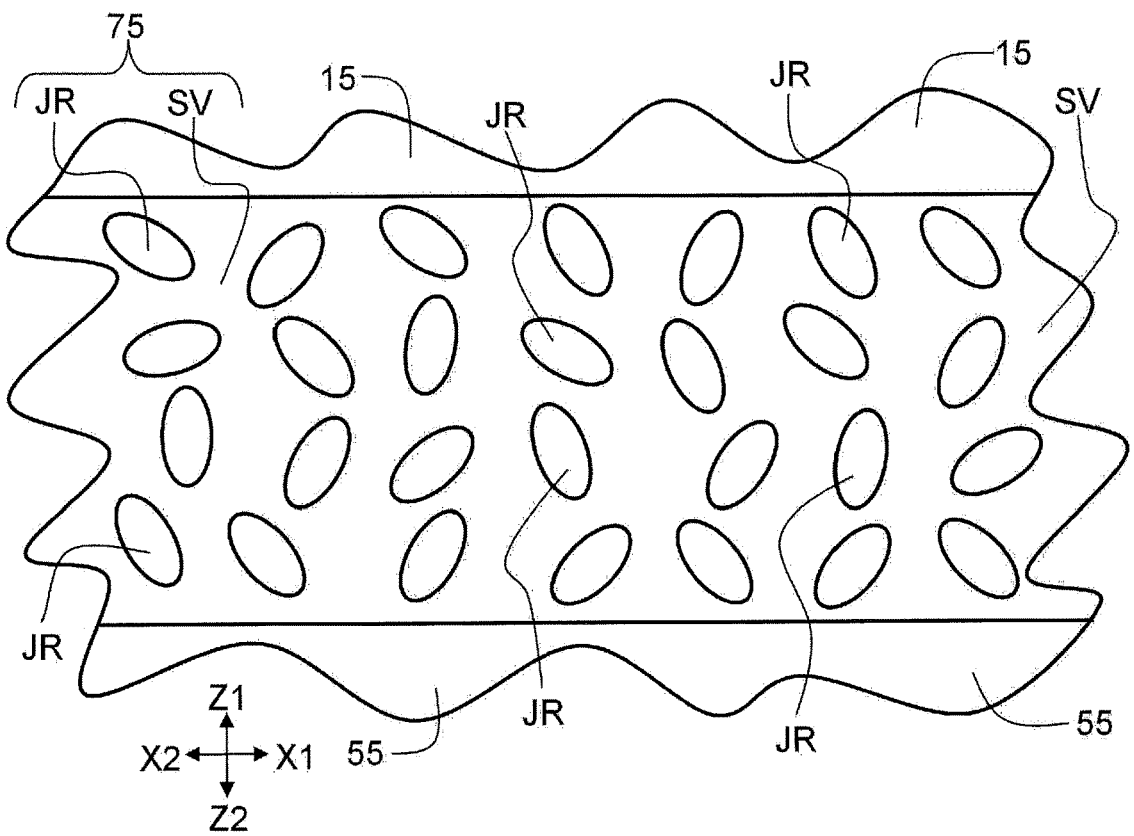
FIG. 10A is a diagram of a magnetic viscous fluid in a state in which no magnetic field is applied.
Figure 10B:
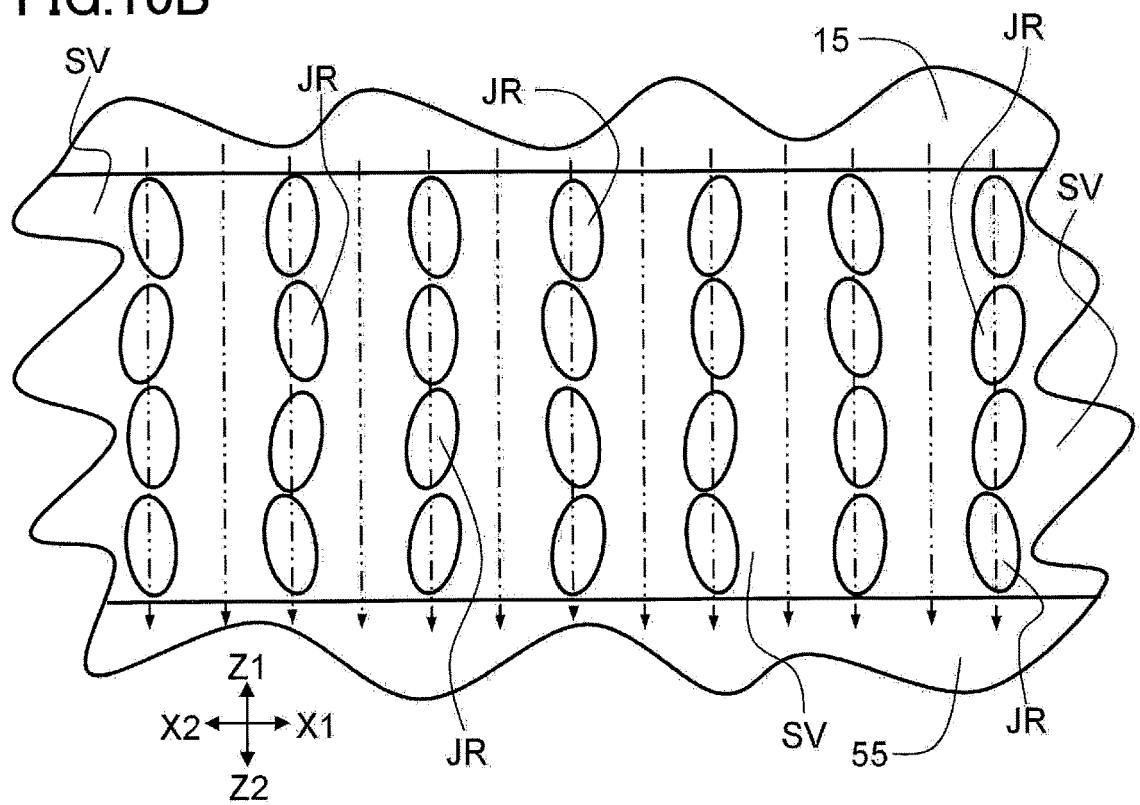
FIG. 10B is a diagram of a magnetic viscous fluid in a state in which the magnetic field is applied.

Lastly, the magnetic viscous fluid 75 of the movable load applying mechanism F5 will be described with reference to FIG. 10A and FIG. 10B. FIG. 10A is a diagram of the magnetic viscous fluid 75 in a state where no magnetic field is applied, and FIG. 10B is a diagram of the magnetic viscous fluid 75 in a state where a magnetic field is applied. In FIG. 10B, the flow of the magnetic field (magnetic flux) is indicated by a two-dot chain line in order to make the explanation easier to understand.

As illustrated in FIG. 10A, the magnetic viscous fluid 75 is a substance, in which fine magnetic particles JR having magnetism such as iron and ferrite are dispersed in a solute SV such as an organic solvent or the like, and generally is called MR fluid (Magneto Rheological Fluid). This magnetic viscous fluid 75 has a characteristic, which the viscosity varies according to the strength of the magnetic field, and is distinguished from a similar magnetic fluid (Magnetic Fluid). A major difference between the two forms is the particle size of the powder, the MR fluid is approximately 1 μm to 1 mm, the magnetic fluid is approximately 10 nm to 1 μm, and the MR fluid has a particle diameter larger than that of the magnetic fluid by approximately 100 to 1000 times.

Here, "the viscosity changes according to the strength of the magnetic field" in the magnetic viscous fluid 75 will be briefly described.

First, in a case in which no magnetic field is applied to the magnetic viscous fluid 75, as illustrated in FIG. 10A, the magnetic particles JR are randomly dispersed in the solute SV. In this case, for example, when the movable member 55 operates (rotates in a plane (X-Y plane) perpendicular to the Z direction illustrated in FIG. 10A), the movable member 55 easily operates by receiving a relatively low resistance force.

Next, when a current is passed through the coil 35 of the magnetic generating mechanism FM5 and a magnetic field is generated, as illustrated in FIG. 10B, the magnetic particles JR are regularly aligned in a straight line along the magnetic field (along the Z direction in FIG. 10B) acting on the magnetic viscous fluid 75. A degree of regularity varies depending on a strength of the magnetic field. That is, the stronger the magnetic field acting on the magnetic viscous fluid 75, the stronger the degree of regularity. Then, a stronger shearing force acts on the direction in which the regularity of the magnetic particles JR aligned in the straight line is broken, and as a result, the viscosity with respect to this direction becomes stronger. In particular, the highest shearing force works in the direction (X-Y plane direction in FIG. 10B) perpendicular to the applied magnetic field.

Then, when the movable member 55 is operated in such energized state (a state depicted in FIG. 10B), a resistance force is generated to the movable member 55, this resistance force (rotational load) is transmitted to the operation body 11 engaged with the movable member 55. Thereby, the movable load applying mechanism F5 is able to impart rotational load (load against a rotation) of a rotational operation with respect to the operator. At that time, because the operation controlling part (FS) controls an amount of current to be supplied to the coil 35, the timing of energization, and the like, it is possible to freely apply any load to the operator at any timing.

Figure 11:
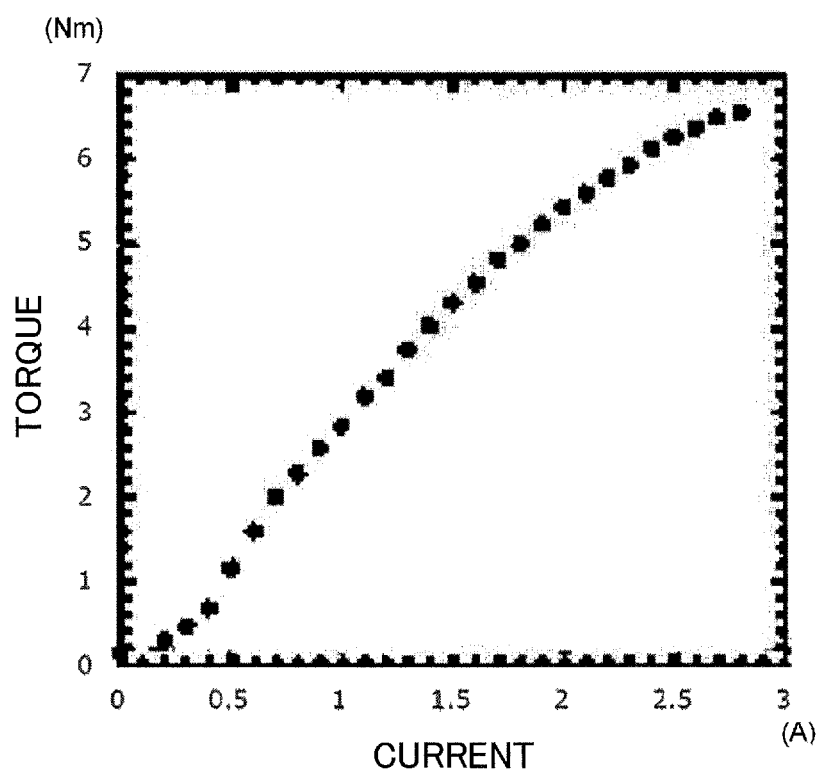
FIG. 11 is a diagram for explaining the magnetic viscous fluid of the operation device according to the first embodiment, and is a graph depicting an example of a relationship between a current flowing through the magnetic generating mechanism and a torque applied to an operation body.

FIG. 11 illustrates a result of verifying that "the resistance (rotational load) becomes strong according to the strength of the magnetic field". FIG. 11 is a graph illustrating an example of a relationship between the current flowing through the coil 35 of the magnetic generating mechanism FM5 and a torque applied to the operation body 11. A horizontal axis indicates a current (A) and a vertical axis indicates the torque (Nm). This torque corresponds to the resistance force (rotational load) applied to the operation body 11.

As illustrated in FIG. 11, when the current flowing through the coil 35 of the magnetic generating mechanism FM5 is increased, the magnetic field generated along with the increase is increased, and the torque is increased with the strength of the magnetic field, that is, the resistance force (rotational load) applied to the operation body 11 increases. Whereby, it is possible to apply a variable load to the operation body 11 (operation member 1) by utilizing "the viscosity changes according to the strength of the magnetic field and the resistance becomes strong" in the magnetic viscous fluid 75.

In the first embodiment, the magnetic viscous fluid 75 having the above characteristics is suitably used. As illustrated in FIG. 4, the magnetic viscous fluid 75 is disposed in the gap 5g (the first gap 5ga, refer to FIG. 7) between the first yoke 15 and the movable member 55. In particular, as illustrated in FIG. 4, the magnetic viscous fluid 75 is filled in the gap 5g (the first gap 5ga) between the first facing portion TB5 and the second facing portion TC5 of the first yoke 15 and the movable member 55.

By this configuration, with respect to the movable member 55, which moves in a direction crossing the magnetic flux formed between the first yoke 15 (the first facing portion TB5) and the movable member 55, and the movable member 55 and the first yoke 15 (the second facing portion TC5), load (rotational load) is applied by the magnetic viscous fluid 75. As a result, the load (rotational load) is applied to the operation body 11 via the movable member 55 and the movable shaft 11j. Therefore, it is possible to provide the operation device 100 capable of obtaining preferable operation feeling.

Moreover, in the first embodiment, an area of a first facing surface 15r facing the magnetic viscous fluid 75 in the first facing portion TB5 illustrated in FIG. 9A is the same as an area of a second facing surface 15t facing the magnetic viscous fluid 75 in the second facing portion TC5.

Thereby, a magnetic flux density becomes equal between an entrance and an exit of the magnetic flux, and the magnetic flux generated from the coil 35 is able to effectively applied to control the viscosity of the magnetic viscous fluid 75. Thus, the load (rotational load) is uniformly applied to the movable member 55, and it is possible to apply a more preferable operation feeling to the operator.

Furthermore, in the first embodiment, the gap 5g (the second gap 5gb) between the movable member 55 and the second yoke 25 is also filled with the magnetic viscous fluid 75. The magnetic flux, which is formed from the first yoke 15 (the first facing part TB5) to the second yoke 25 via the movable member 55 and the second yoke 25 through the movable member 55 to the first yoke 15 (second facing portion TC5), acts also on the magnetic viscous fluid 75 filled therein.

By the formed magnetic flux, the magnetic particles JR are aligned in a direction perpendicular to the direction, in which the movable member 55 operates, and a stronger rotational load is applied. Whereby, a further rotational load is imparted, and even with an equivalent magnetic field, it is possible to apply the operator a greater operation feeling.

By the operation unit U1 according to the first embodiment formed as described above, because as a method of imparting an external force (force sense) such as resistance force and thrust corresponding to an operation amount and operation direction of the operation member 1, the motor 810 is not used as in Conventional Example 1, it is possible to realize minimization and also possible to reduce a size and power consumption. In addition, there is no sound generated when an external force (force sense) is applied.

Figure 12:
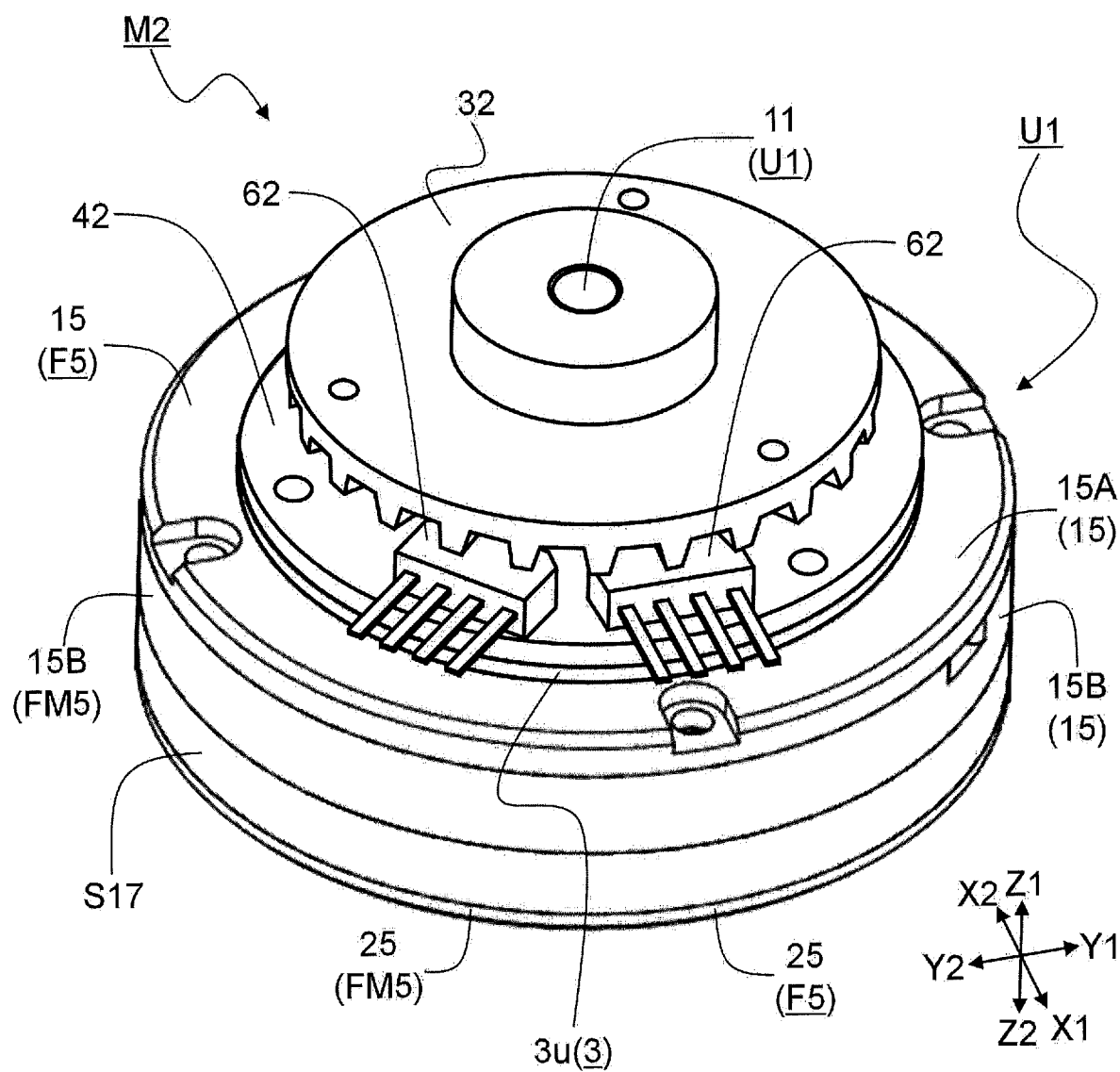
FIG. 12 is a diagram for explaining a position detecting part of the operation device according to the first embodiment, and is an upper perspective view, in which an operation section of the operation member depicted in FIG. 2 is omitted.
Figure 13:
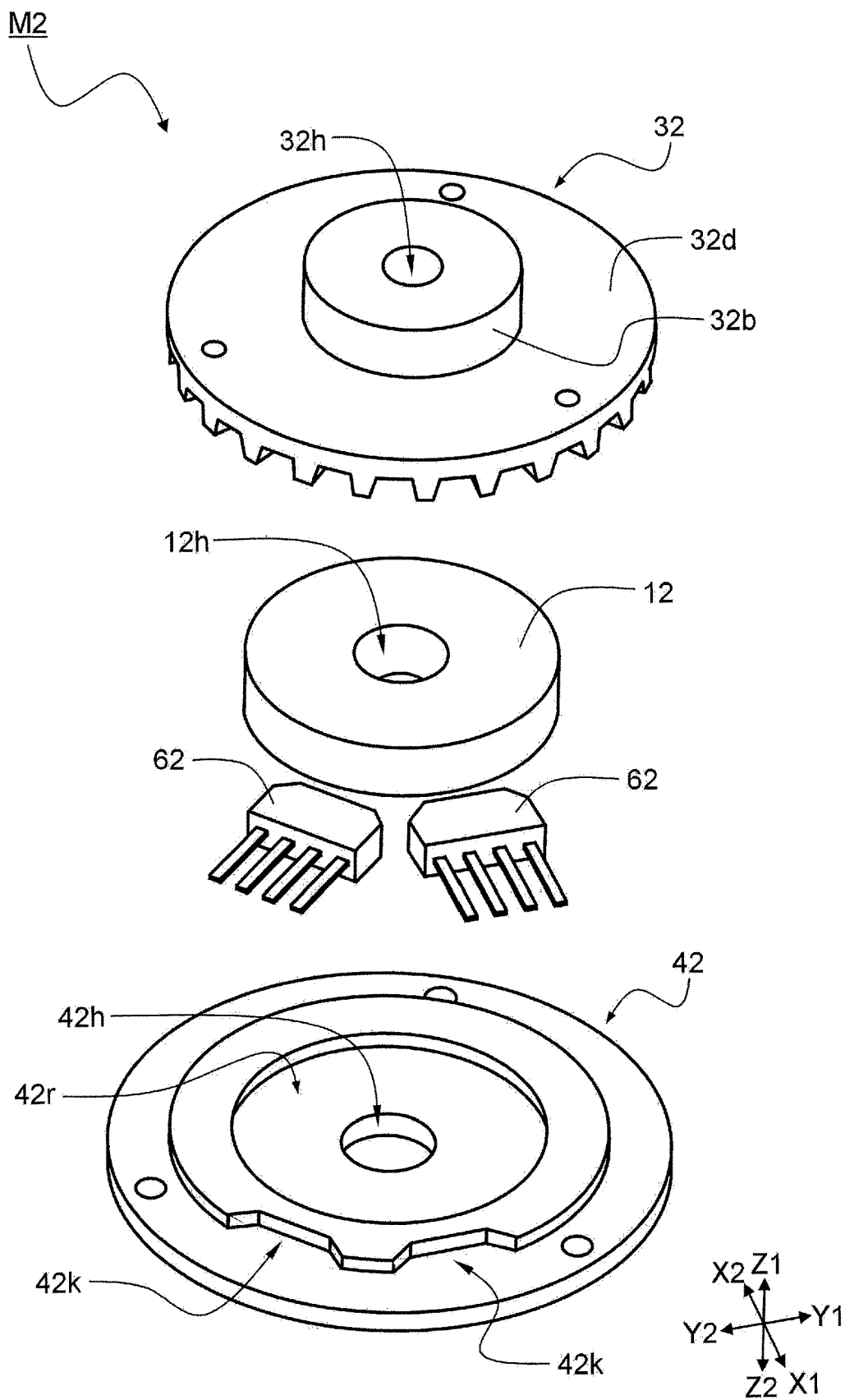
FIG. 13 is a diagram for explaining the position detecting part of the operation device according to the first embodiment, and is an exploded perspective view of the position detecting part.

Next, the position detecting part M2 of the operation device 100 will be described. FIG. 12 is a diagram for explaining the position detecting part M2, and is an upper perspective view, in which the operation section 51 of the operation member 1 depicted in FIG. 2 is omitted. FIG. 13 is an exploded perspective view of the position detecting part M2.

As depicted in FIG. 13, the position detecting part M2 of the operation device 100 is formed to include a permanent magnet 12 for generating magnetism, a movable yoke 32 disposed on one side of the permanent magnet 12, a fixed yoke 42 disposed on an other side of the permanent magnet 12, and two magnetic sensors 62 disposed between the movable yoke 32 and the fixed yoke 42 (refer to FIG. 12) for detecting magnetism. As illustrated in FIG. 12, the position detecting part M2 is disposed in a vicinity of the operation body 11 of the operation unit U1 and detects the position of the operation body 11. That is, in the first embodiment, the position detecting part M2 detects a rotational motion of the operation body 11, for example, detects a rotational angle of the operation body 11 to specify a position of the operation body 11.

First, a general samarium cobalt magnet or the like is used as the permanent magnet 12 of the position detecting part M2, and the permanent magnet 12 is formed in a circular ring shape having a through hole 12*h* at a center as depicted in FIG. 13. In the through hole 12*h*, as depicted in FIG. 4, the operation body 11 is rotatably inserted.

Next, a soft magnetic material such as iron is used as the movable yoke 32 of the position detecting part M2, and the movable yoke 32, and as illustrated in FIG. 13, the movable yoke 32 is formed to include a disc section 32*b* being disc-shaped, and a base section 32*d* being circular-shaped and provided at a center of the disc section 32*b*.

In the center of the movable yoke 32, a through hole 32*h* penetrating the disc section 32*b* and the base section 32*d* is formed, and as depicted in FIG. 4, the operation body 11 is inserted and fitted in the through hole 32*h*. In addition, as depicted in FIG. 4, the base section 32*d* and the operation section 51 are engaged with each other. Then, according to a manipulation of the operator, as the operation section 51 moves (rotates), the movable yoke 32 rotates and the operation body 11 rotates.

Moreover, as depicted in FIG. 12 and FIG. 13, a side of the disc section 32*b*, which faces the permanent magnet 12, is formed in an uneven shape so that a distance to the permanent magnet 12 changes. Whereby, when the movable yoke 32 is rotated, a magnetic field between the permanent magnet 12 and the movable yoke 32 changes. That is, the magnetic field is strengthened at a recess portion and the magnetic field is weakened at a protrusion portion.

Next, a soft magnetic material such as iron is used for the fixed yoke 42 of the position detecting part M2. As depicted in FIG. 13, the fixed yoke 42 has a disk-like appearance and is formed to include a through hole 42*h* formed at a center, a dent section 42*r*, on which the permanent magnet 12 is placed and housed, and a notch 42*k* on which the magnetic sensor 62 is placed and housed. A magnetic flux generated from the permanent magnet 12 forms a magnetic path from the movable yoke 32 to the fixed yoke 42.

The magnetic sensor 62 of the position detecting part M2 is formed to include a magnetic detection element (not depicted, but denoted by 62K in FIG. 1) for detecting the change in the magnetic field, and a sensor controlling part (not depicted in other figures, but denoted by SS in FIG. 1) for calculating an angle based on a signal from the magnetic detection element. As illustrated in FIG. 12 and FIG. 13, the magnetic sensor 62 has four extraction terminals, and the magnetic detection element and the sensor controlling part (SS) are packaged with a synthetic resin. As depicted in FIG. 12, the two magnetic sensors 62 are disposed between the movable yoke 32 and the fixed yoke 42, and detect the change in magnetic field between the movable yoke 32 and the fixed yoke 42.

Moreover, as the magnetic detecting element a Hall element detecting magnetism by using the Hall effect is used. Also, an integrated circuit (IC) is used as the sensor controlling part (SS). The arrangement position of the two magnetic sensors 62 and the position where the uneven shape of the disc section 32*b* is provided appropriately correspond to each other so that the magnetic fields detected by the two magnetic sensors 62 are different from each other.

Figure 14:
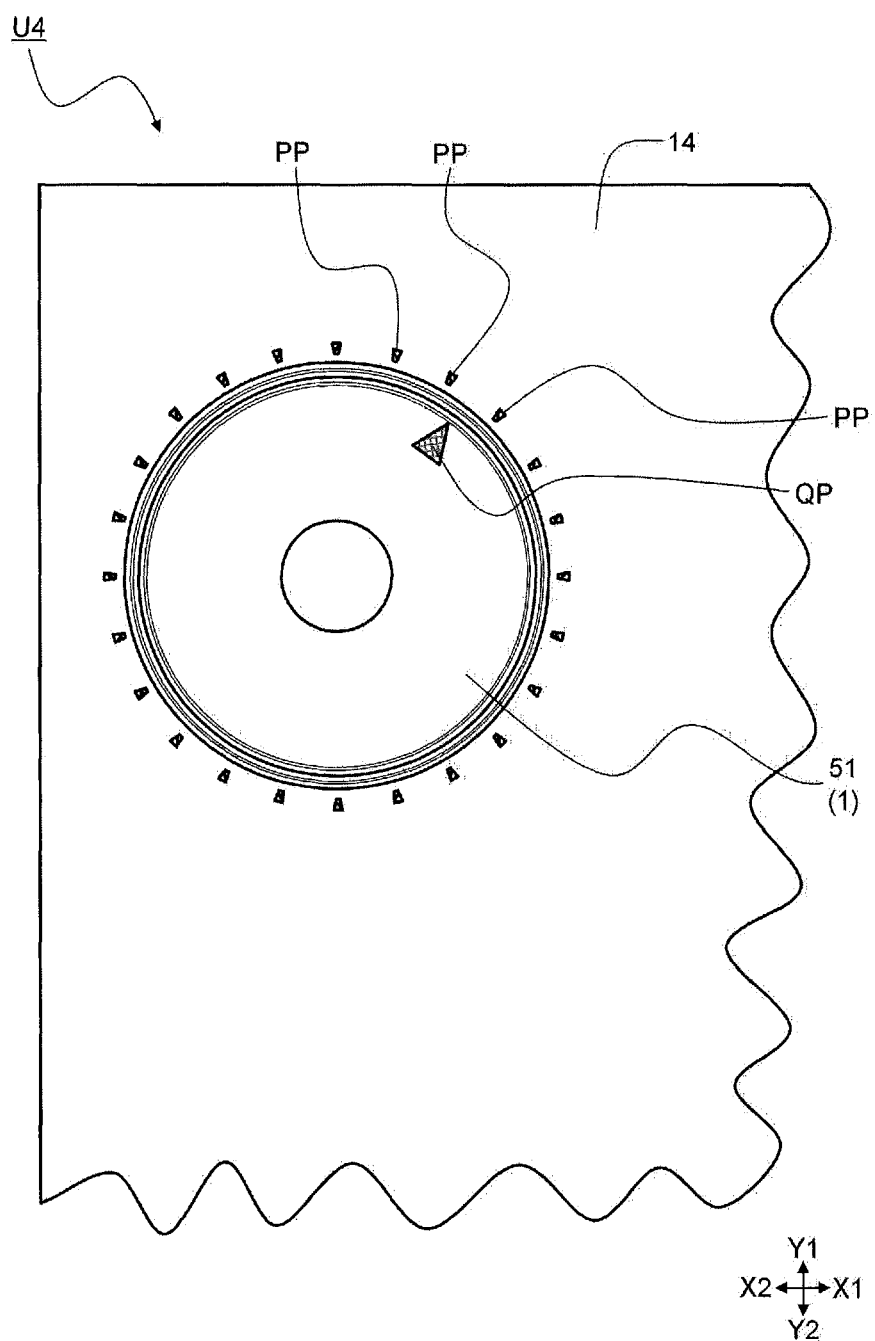
FIG. 14 is a diagram for explaining a display unit of the operation device according to the first embodiment, and illustrates a part of the top view of the display unit.

Next, the display unit U4 of the operation device 100 will be described. FIG. 14 is a schematic diagram illustrating the display unit U4, which is a part of a top view of the display unit U4.

A display device such as a widely used liquid crystal display (LCD, liquid crystal display) or the like is used for the display unit U4 of the operation device 100, and as depicted in FIG. 14, the display unit U4 is formed to include the display part (liquid crystal panel) for displaying an operation position PP of the operation body 11 (operation section 51), and a display controlling part (not depicted in other figures, but denoted by PS in FIG. 1) for displaying the operation body 11 (operation section 51) and a desired position (operation position PP) on the display part 14. The display controlling part (PS) is incorporated in a driving module of the liquid crystal panel.

In the first embodiment, as illustrated in FIG. 14, the display controlling part (PS) displays an image of the operation section 51 with a point position QP clearly displayed on the display part 14 of the liquid crystal panel, and an image of the operation position PP (position desired and visually recognized by the operator) where the operation body 11 is positioned. As a result, the operation position PP can be variably displayed in conjunction with a state of the operation body 11 of the operation unit U1. That is, when the operator manipulates the operation body 11, even if the position at which the operation body 11 of the operation unit U1 is operated and the position (operation position PP) of the operation desired by the operator is shifted, it is possible to match a position (operation position PP) of the operation desired by the operator with a display position (at a position to be visually recognized) displayed on the display part 14 of the display unit U4.

Next, the sound generating part (H6) of the operation device 100 will be described. The sound generating part (H6) is formed to include a sound generation member (16) for generating a general electronic sound using a piezoelectric element, and a sound controlling part (not depicted in other figures, but denoted by HS in the block diagram of FIG. 1) for controlling the sound generating member (16). The sound controlling part (HS) of the sound generating part (H6) drives the sound generation member (16) in conjunction with a state of the operation unit 11 of the operation unit U1. That is, it is possible to generate any electronic sound according to an actual operated position of the operation body 11 and a load on the operation body 11.

Lastly, a controller (C8) of the operation device 100 will be described. The controller (C8) is formed by using an integrated circuit (IC). As illustrated in FIG. 1, the operation controlling part (FS) of the operation unit U1, the sensor controlling part (SS) of the position detection part M2, the display controlling part (PS) of the display unit U4, and the sound controlling part (HS) of the sound generating part (H6) are electrically connected to each other. The controller (C8) controls the operation controlling part (FS), the sensor controlling part (SS), the display controlling part (PS) and the sound controlling part (HS) based on information from the operation unit U1 and the position detecting part M2.

Next, effects of the operation device 100 according to the first embodiment will be summarized below.

In the operation device 100 according to the first embodiment is formed to include the movable member 55 that operates by the movable load applying mechanism F5 being engaged with the operation body 11 (movable shaft 11*j*), the coil 35 and the first yoke 15 of the magnetic generating mechanism FM5, which are disposed on one side of the movable member 55, and the magnetic viscous fluid 75 existing in at least a part of the gap 5*g* (the first gap 5*ga*). Whereby, a magnetic field is generated by energizing the coil 35, and a magnetic path is formed to widen from the first yoke 15, so that the magnetic particles JR in the magnetic viscous fluid 75 are aligned along the magnetic flux.

Therefore, with respect to the movable member 55 moving in a direction crossing the magnetic flux formed between the first yoke 15 and the movable member 55 and the movable member 55 and the first yoke 15, a load is applied to the movable member 55 by the magnetic viscous fluid 75, and a load is applied to the operation body 11 via the movable member 55 and the movable shaft 11*j*.

Moreover, the operation device 100 includes the controller (C8), which controls the operation controlling part (FS) of the operation unit U1 for controlling energization to the coil 35, and the display controlling part (PS) of the display unit U4, which controls display on the display part 14; hence, even in a case in which the operated position of the operation body 11 of the operation unit U1 and the position desired by the operator (operation position PP) are displaced when the operator manipulates the operation body 11, it is possible to match the operation position PP desired by the operator with the display position (position to be visually recognized) displayed on the display part 14 of the display unit U4. As a result, it is possible to impart a preferable operation feeling (operational feel) to the operator.

Also, the operation device 100 includes the sound generation member (16) for generating an electronic sound, and the sound controlling part (HS) for controlling the sound generation member (16), and the sound controlling part (HS) is controlled by the controller; hence, it is possible to generate any electronic sound according to the actual operated position of the operation body 11 and the load on the operation body 11. As a result, it is possible to impart a preferable operation feeling (operation feel) to the operator.

Moreover, because the movable member 55 is made of a soft magnetic material, a magnetic path is reliably formed from the first yoke 15 (the first facing portion TB5) to the movable member 55 and from the movable member 55 to the first yoke 15 (the second facing portion TC5), and the magnetic particles JR in the magnetic viscous fluid 75 are aligned in a facing surface direction (Z direction depicted in FIG. 4), in which the first yoke 15 and the movable member 55 face each other.

Therefore, a stronger load (rotational load) is applied to the movable member 55 moving in a direction crossing the facing surface direction, in which the magnetic particles JR are aligned. As a result, a stronger load is applied to the operation body 11 via the movable member 55 and the movable shaft 11*j*, so as to impart a preferable operation feeling to the operator.

Because the magnetic generating mechanism FM5 includes the second yoke 25 disposed opposite to an other side of the movable member 55, the magnetic path is reliably formed from the first yoke 15 (the first facing portion TB5) to the second yoke 25 and from the second yoke 25 to the first yoke 15 (the second facing portion TC5). Therefore, it is possible to align the magnetic particles JR in a direction perpendicular to a direction in which the movable member 55 operates, and it is possible to apply a stronger load (rotational load).

Furthermore, because the magnetic viscous fluid 75 is filled in the gap 5*g* (second gap 5*gb*) between the movable member 55 and the second yoke 25, it is possible to apply a further load to the movable member 55 moving in the direction crossing the magnetic flux. By these features, it is possible to apply a stronger load (rotational load) to the operation body 11 via the movable member 55 and the movable shaft 11*j*, and also, it is possible to impart a larger operational feel to the operator even for a comparable magnetic field.

Figure 15:
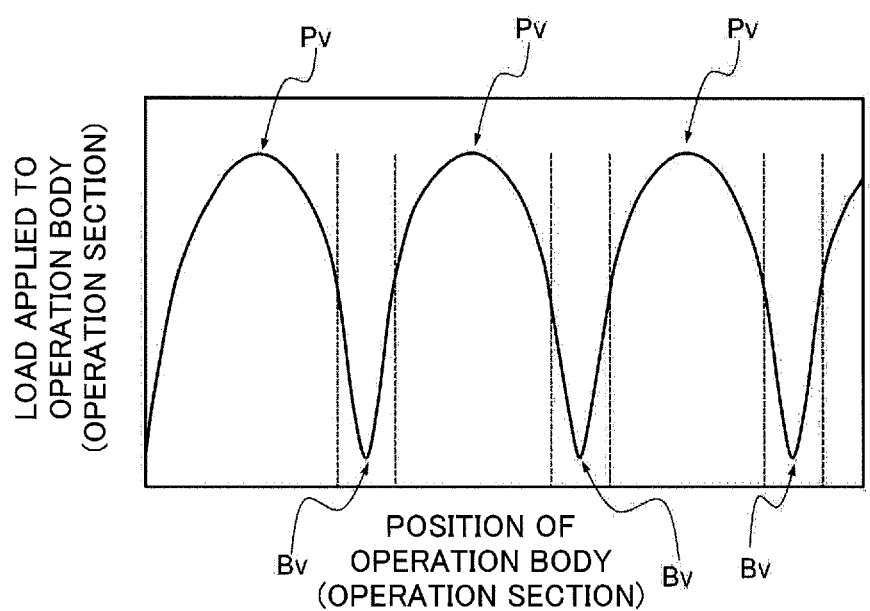
FIG. 15 is a schematic diagram illustrating a control method in the operation device of the first embodiment, and is a graph illustrating an example of a load curve of a load applied to the operation body.
Figure 16:
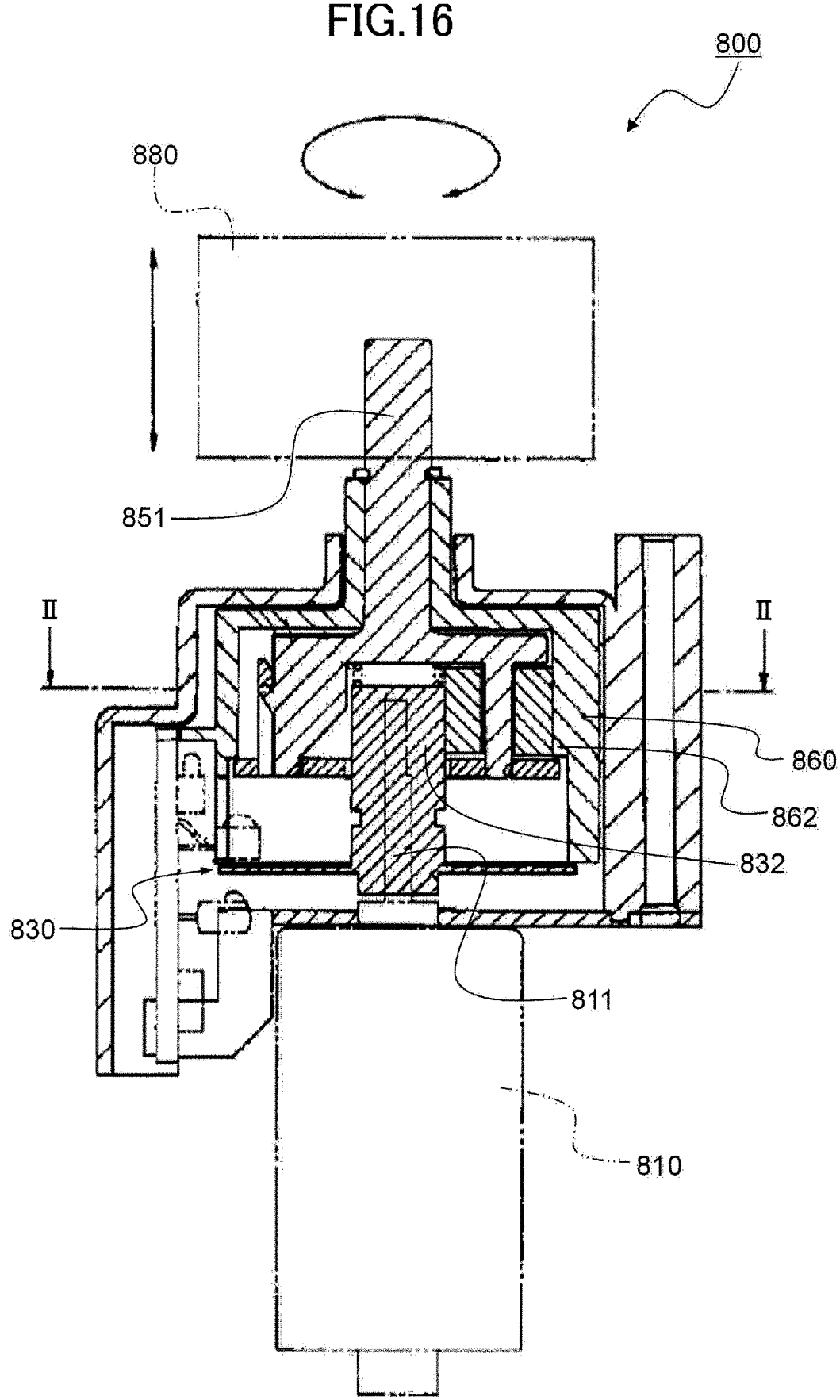
FIG. 16 is a diagram illustrating a manual input device of Conventional Example 1, and is a vertical cross-sectional view illustrating a main part of a basic configuration.
Figure 17:
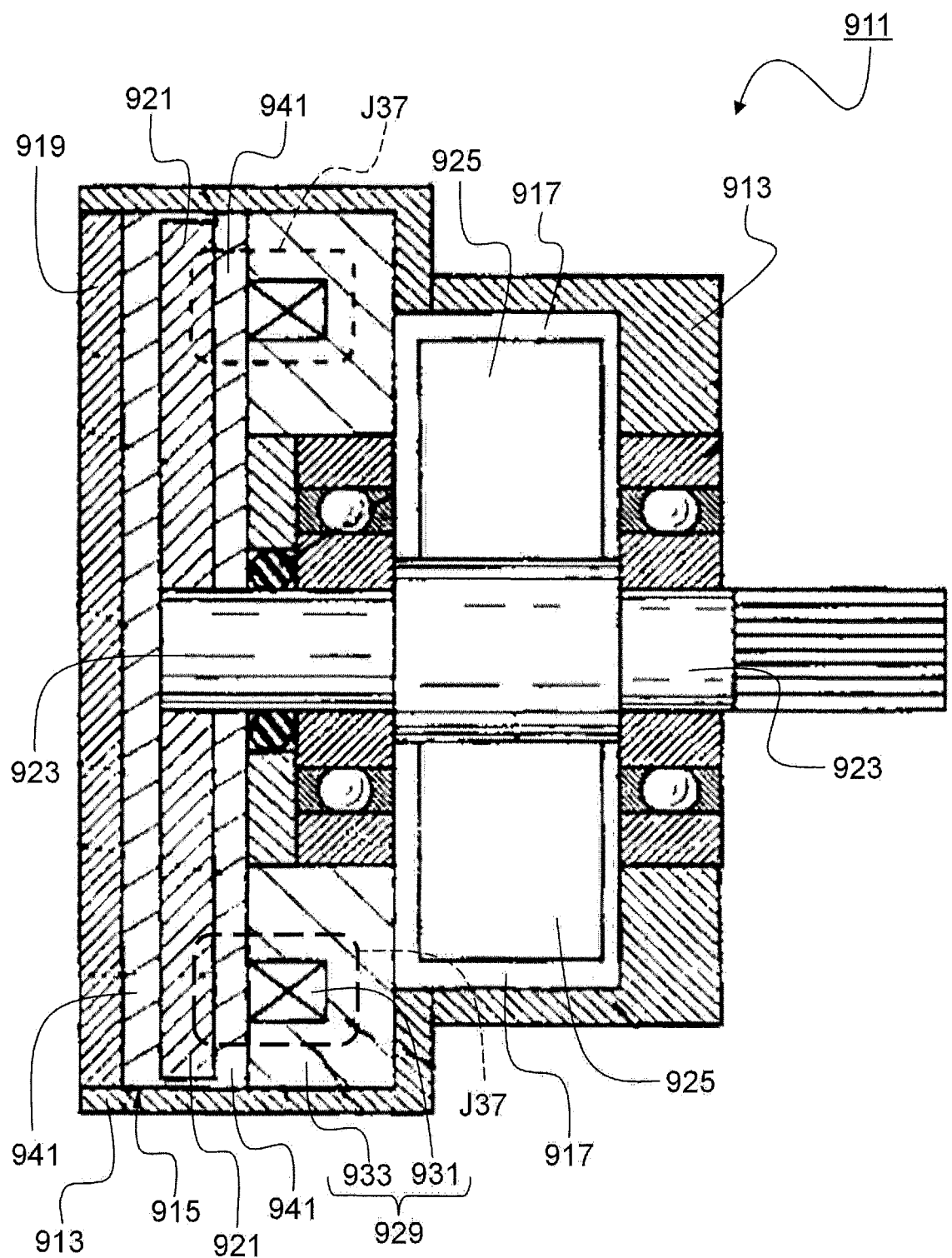
FIG. 17 is a view for explaining a manual brake of Conventional Example 2, and is a longitudinal sectional view.

Next, a control method in the operation device 100 according to the first embodiment of the invention will be briefly described with reference to FIG. 14 and FIG. 15. FIG. 15 is a schematic diagram illustrating the control method in the operation device 100, and is a graph depicting an example of a load curve of a load applied to the operation body 11. A horizontal axis indicates a position of the operation body 11 (operation section 51), and the vertical axis shows the load applied to the operation body 11.

In the operation device 100 according to the first embodiment, the operation controlling part (FS) of the movable load applying mechanism F5 (magnetic generating mechanism FM5) controls a current value to the coil 35 to load a load curve or the like to the operation body 11, for example, applies a load such as a load curve to the operation body 11 (operation section 51) as illustrated in FIG. 15. In particular, when a rotation operation is performed by an operator's manipulation, the controller (C8) of the operation device 100 sends a command signal an instruction to the operation controlling part (FS) of the magnetic generating mechanism FM5 based on position information (information signal of a position) of the operation body 11 from the position detecting part M2. Next, upon receiving the command signal, the operation controlling part (FS) causes a certain amount of current to flow through the coil 35 in timing, and also changes an amount of current (current value) to flow. In this manner, a load curve having a plurality of peak values Pv and bottom values Bv is formed by strength of the current value to the coil 35 as depicted in FIG. 15.

Also, when the rotation operation is performed by an manipulation of the operator, in a case of shifting from a certain peak value Pv (the first peak value) to a bottom value Bv (first bottom value), and from the first bottom value to the next peak value Pv (second peak value), the controller (C8) sends a command signal to the display controlling part (PS). Then, upon receiving the command signal, the display controlling part (PS) rotates the operation section 51, and displays a state (moving state), in which the point position QP (refer to FIG. 14) of the operation section 51 moves and coincides with the operation position PP, on the display part 14 of the display unit U4. Therefore, even in a case in which an actual position at which the operation body 11 of the operation unit U1 is operated and the operation position PP desired by the operator are displaced when the operator manipulates the operation body 11, it is possible to match the operation position PP desired by the operator with the display position displayed on the display part 14 of the display unit U4.

In particular, in the first embodiment, when there is the operation body 11 in a predetermined range (for example, a range between broken lines depicted in FIG. 15) including the bottom value Bv of the load curve, the controller (C8) controls to display the operation position PP at a desired position on the display part 14. Therefore, even if the actual position at which the operation body 11 is operated and the operation position PP desired by the operator are misaligned in a range where the load received by the operator from the operation body 11 is small, it is possible to visually recognize a display, in which the operation position PP desired by the operator and the display position of the display part 14 match with each other. As a result, it is possible to impart a preferable operation feeling (operational feel) to the operator.

Also, when the rotation operation is performed by the manipulation of the operator, in a case of shifting from the peak value Pv (first peak value) to the bottom value Bv (first bottom value) and from the first bottom value to the next peak value Pv (second peak value), the controller (C8) sends a command signal to the sound controlling part (HS) of the sound generating part (H6). Upon receiving the command signal, the sound controlling part (HS) generates an electronic sound by the sound generating member (16). Therefore, when the operator manipulates the operation body 11, It is possible to display an operation position PP desired by the operator on the display section 14, and to generate a given electronic sound at the same time. In this manner, it is possible to realize the operation feeling (operation feel) as the operator manipulates.

In particular, in the first embodiment, because the controller (C8) generates an electronic sound when there is the operation body 11 in the predetermined range including the bottom value Bv, it is possible for the operator to hear the given electronic sound in the range where the load received from the operation body 11 is small. For this reason, because the operator hears the electronic sound near at an end of the operation, it is possible to more realize the operation feeling (operation feel) as the operator manipulates.

Lastly, effects of the control method of the operation device 100 according to the first embodiment will be summarized below.

In the control method of the operation device 100 of the first embodiment, when shifting from the first peak value of the load curve formed by the operation controlling part (FS) to the first bottom value and from the first bottom value to a next second peak value, the controller (C8) controls the display controlling part (PS) to display a movement state of the operation position PP (display position) on the display part 14. By this configuration, in a case in which the operator manipulates the operation body 11, even if a position at which the operation body 11 of the operation unit U1 is operated and the operation position PP desired by the operator are misaligned, it is possible to match the operation position PP desired by the operator with the display position displayed on the display part 14 of the display unit U4. As a result, it is possible to impart a preferable operation feeling (operation feel) to the operator.

Moreover, because the operation position PP is displayed at a desired position on the display part 14 when the operation body 11 is in the predetermined range including the bottom value Bv of the load curve, even if the operated position of the operation body 11 is displaced from the operation position PP desired by the operator in the range where the load received by the operator from the operation body 11 is small, it is possible to visually recognize a display, in which the operation position PP desired by the operator and the display position of the display part 14 match to each other. Therefore, it is possible to impart a preferable operation feeling (operation feel) to the operator.

Also, when shifting from the peak value Pv of the load curve formed by the operation controlling part (FS) to the bottom value Bv and the bottom value Bv to the next peak value Pv, the controller (C8) controls the sound controlling part (HS) to generate an electronic sound by the sound generating member (16). Therefore, when the operator manipulates the operation body 11, it is possible to display an operation position PP desired by the operator on the display section 14, and to generate a given electronic sound at the same time. Whereby, it is possible to realize the operational feeling (operation feel) as the operator manipulates.

Furthermore, because the controller (C8) generates the electronic sound when the operation body 11 is in the predetermined range across the bottom value Bv, it is possible for the operator to hear a given electronic sound in a range where the load received from the operation body 11 is small. Therefore, it is possible to more realize the operation feeling (operation feel) as the operator manipulates.

It should be noted that the present invention is not limited to the above-described embodiment, but may be carried out by modifying as follows, for example, and these embodiments also belong to the technical scope of the present invention.

First Modification

In the first embodiment, the operation unit U1 and the display unit U4 are arranged, but not limited to, at positions separated from each other; for example, the display unit U4 may be arranged in a vicinity of the operation unit U1 so that the operator is able to visually recognize both units U1 and U4.

Second Modification

In the first embodiment, the magnetic viscous fluid 75 is filled so as to fill an accommodation space (the accommodation space formed by the first yoke 15, the second yoke 25, and the sidewall spacer S17), in which the movable member 55 is accommodated. However, the present invention is not limited to this configuration, the magnetic viscous fluid 75 may be present in at least a part of the gap 5g.

Third Modification

In the first embodiment, as the sound generating part (H6), the sound generating member (16), which suitably produces electronic sound, is used, but it is not limited to this member. For example, a mechanical mechanism, which generates sound by striking an object to be hit, may be used.

Fourth Modification

In the first embodiment, the position detecting part M2 is formed by the permanent magnet 12, the movable yoke 32, and the two magnetic sensors 62, but the present invention is not limited this configuration. For example, a so-called rotary type variable resistor composed of a substrate having a resistor pattern formed thereon and a slider slidably contacting the resistor pattern may be used.

Fifth Modification

In the first embodiment, the movable member 55 is preferably formed of a soft magnetic material. However, the movable member 55 is not limited to this material, and may be a nonmagnetic material such as a synthetic resin.

Sixth Modification

In the first embodiment, the first facing portion TB5 and the second facing portion TC5 are formed by the lateral yoke 15B and the lower yoke 15C of the first yoke 15; however, only the lower yoke 15C faces the movable member 55 so that the first facing portion TB5 and the second facing portion TC5 may not be provided.

Seventh Modification

In the first embodiment, the movable member 55 has, not limited to, a disk shape, and the movable member 55 may have a rectangular shape or a polygonal shape, for example.

Eighth Modification

In the first embodiment, the movable section slit 55s is provided in the movable member 55 made of a soft magnetic material, but the movable section slit 55s may not be provided. In that case, it is preferable that the movable member 55 is made of a nonmagnetic material.

Ninth Modification Tenth Modification

In the first embodiment, the movable member 55 is a rotary type operation device, but the movable member 55 is not limited to this rotation operation. For example, the movable member 55 may be a slide type operation device, in which a movable member slides in a direction crossing an extending direction of a support {Ninth Modification}.

Moreover, for example, the movable member 55 may be a pressing type operation device, which pushes in the extending direction of the support {Tenth Modification}. In a case of this pressing type operation device, by a configuration in which a movable member and a first yoke (and a second yoke) face each other in a direction intersecting with a push operation direction (preferably, a perpendicular direction), and a magnetic viscous fluid is filled in a gap between the movable member and the first yoke (and the second yoke), it is possible to apply a load appropriately.

According to the above described embodiments, a first aspect of the present invention relates to an operation device includes an operation unit including an operation body worked by a manipulation of an operator; a position detecting part that detects a position of an operation where the operation body is located; and a display unit that displays an operation position of the operation body, wherein the operation unit includes an operation member that includes an operation member manipulated by the operator and having the operation body, a support body that freely supports the operation of the operation body, and a movable load applying mechanism that applies a load to the operation body, in which the operation body includes a movable shaft enabling the operation, wherein the movable load applying mechanism includes a movable member that operates in engagement with the movable shaft, a magnetic generating mechanism that sandwiches the movable member and a gap, and faces one side thereof, and a magnetic viscous fluid that exists in at least a part of the gap and whose viscosity changes according to a strength of a magnetic field, and an operation controlling part that controls the magnetic generation mechanism, wherein the magnetic generation mechanism includes a coil that generates a magnetic field by energization by the operation controlling part, and a first yoke that is provided so as to surround the coil and is disposed on one side of the movable member, wherein the display unit includes a display part that displays the operation position, and a display controlling part that controls a display on the display part, and a controller that controls the operation controlling part and the display controlling part.

According to this operation device, a magnetic field is generated by energizing the coil, and a magnetic path is formed to be widened from a first yoke, so that magnetic particles in a magnetic viscous fluid are aligned along a magnetic flux. Hence, a load is applied by the magnetic viscous fluid to the movable member that moves in a direction along the magnetic flux formed between the first yoke and the movable member, and the movable member and the first yoke, and the load is applied to the operation body via the movable member and the movable shaft. Even if a position of the operation body of the operation unit and a position (operation position) desired by the operator deviate are displaced with each other when the operator manipulates the operation body, it is possible to match the operation position desired by the operator with the display position displayed on the display part of the display unit. As a result, it is possible to impart a favorable operation feeling (operational feel) to the operator.

Moreover, the operation device may include a sound generating member that generates electronic sound; and a sound controlling part that controls the sound generating member, wherein the sound controlling part is controlled by the controller.

According to this operation device, it is possible to generate any electronic sound according to an actual operation position of the operation body and a load on the operation body. As a result, it is possible to impart a preferable operation feeling (operation feel) to the operator.

Moreover, in the operation device, the movable member may be made of a soft magnetic material.

According to this operation device, a magnetic path is reliably formed from a first yoke to the movable member and from the movable member to the first yoke so that magnetic particles in the magnetic viscous fluid are aligned in a facing surfaces direction facing each other. Therefore, a stronger load is applied to the movable member that moves in a direction crossing the facing surface direction, in which the magnetic particles are aligned. As a result, a strong load is applied to the operation body via the movable member and the movable shaft, and a preferable operation feeling is imparted to the operator.

Moreover, in the operation device, the magnetic generating mechanism may include a second yoke disposed facing the movable member on an other side of the movable member, and the gap between the movable member and the second yoke is filled with the magnetic viscous fluid.

According to this operation device, it is possible to align the magnetic particles in a direction perpendicular to a direction, in which the movable member operates, and it is possible to apply a stronger load. Furthermore, it is possible to apply a further load to the movable member moving in a direction traversing the magnetic flux. As a result, even with the same magnetic field, it is possible to impart a greater operation feeling to the operator.

A second aspect of the present invention relates to a control method of an operation device including an operation unit including an operation body worked by a manipulation of an operator; a position detecting part that detects a position of the manipulation where the operation body is located; a display unit that displays an operation position of the operation body; and a controller that controls the operation controlling part and the display controlling part, wherein the operation unit includes an operation member that includes an operation member manipulated by the operator and having the operation body, a support body that freely supports the operation of the operation body, and a movable load applying mechanism that applies a load to the operation body, in which the operation body includes a movable shaft enabling the operation, wherein the movable load applying mechanism includes a movable member that operates in engagement with the movable shaft, a magnetic generating mechanism that sandwiches the movable member and a gap, and faces one side thereof, and a magnetic viscous fluid that exists in at least a part of the gap and whose viscosity changes according to a strength of a magnetic field, and an operation controlling part that controls the magnetic generation mechanism, wherein the magnetic generation mechanism includes a coil that generates a magnetic field by energization by the operation controlling part, and a first yoke that is provided so as to surround the coil and is disposed on one side of the movable member, wherein the display unit includes a display part that displays the operation position, and a display controlling part that controls a display on the display part, the control method is characterized by forming, by the operation controlling part, a load curve having a plurality of peak values and a plurality of bottom values of the load by a strength of a current value to the coil, and controlling, by the controller, the display controlling part to display, on the display part, a shift state of the operation position in a case of shifting from a first peak value to a first bottom value and from the first bottom value to a next second peak value among the plurality of peak values and the plurality of bottom values.

According to this operation method, even if a position at which the operation body of the operation unit is operated and an operation position desired by the operator are displaced when the operator manipulates the operation body, it is possible to match the operation position desired by the operator with the display position displayed on the display part of the display unit. As a result, it is possible to impart a preferable operation feeling (operation feel) to the operator.

Moreover, in the control method of the operation device, the controller may cause the operation position to be displayed at a desired position on the display part in a case in which the operation body is located in a predetermined range including a bottom value of the load curve.

According to this operation method, even if the operated position of the operation body is displaced from the operation position desired by the operator in a range where the load received by the operator from the operation body is small, it is possible to visually recognize a display in which the operation position desired by the operator and the display position match to each other.

Furthermore, in the control method of the operation device, the operation device further may include a sound generating member that generates electronic sound, and a sound controlling part that controls the sound generating member, wherein the controller controls the sound controlling part to generate the electronic sound, in a case of shifting from a peak value to a bottom value and from the bottom value to a next peak value.

According to this operation method, it is possible to generate any electronic sound at the same time that the operation position desired by the operator is displayed on the display part when the operator manipulates the operation body. By this operation method, it is possible to realize the operation feeling (operation feel) as the operator manipulates.

Furthermore, in the control method of the operation device, the controller may generate the electronic sound when the operation body is located in a predetermined range including the bottom value.

According to this operation method, it is possible to hear any electronic sound in a range where the load, which the operator receives from the operation body, is small. By this operation method, it is possible to more realize the operation feeling (operation feel) as the operator manipulates.

DESCRIPTION OF THE REFERENCE NUMERALS

U1 operation unit
1 operation member
11 operation body
11j movable shaft
FS operation controlling part
M2 position detecting part
3 supporting body
U4 display unit
14 display part
PS display controlling part
F5 movable load applying mechanism
FM5 magnetic generating mechanism
15 first yoke
25 second yoke
35 coil
55 movable member
5g gap
75 magnetic viscous fluid
H6 sound generation part
16 sound generation member
HS sound controlling part
C8 controller
Bv bottom value
Pv peak value
PP operation position
100 operation device

The invention claimed is:

1. An operation device, comprising:
an operation unit including an operation body worked by a manipulation of an operator;
a position detecting pan that detects a position of an operation where the operation body is located; and
a display unit that displays an operation position of the operation body,
wherein the operation unit includes
an operation member that includes an operation member manipulated by the operator and having the operation body,
a support body that freely supports the operation of the operation body, and
a movable load applying mechanism that applies a load to the operation body,
in which the operation body includes a movable shaft enabling the operation,
wherein the movable load applying mechanism includes
a movable member that operates in engagement with a movable shaft,
a magnetic generating mechanism that sandwiches the movable member and a gap, and races one side thereof,
a magnetic viscous fluid that exists in at least a part of the gap and whose viscosity changes according to a strength of a magnetic field, and
an operation controlling part that controls the magnetic generation mechanism,
wherein the magnetic generation mechanism includes
a coil that generates a magnetic field by energization by the operation controlling part, and
a first yoke that is provided so as to surround the coil and is disposed on one side of the movable member,
wherein a load curve having a plurality of peak values and a plurality of bottom values of the load is formed depending on a strength of a current value to the coil by the operation controlling part, and
wherein the display unit includes
a display part that displays the operation position, and
a display controlling part that controls a display on the display part, and
a controller that controls the operation controlling part and the display controlling part,
wherein the controller controls the display controlling, part to display, on the display part, a shift state of the operation position in a case of shifting from a first peak value to a first bottom value and from the first bottom value to a next second peak value among the plurality of peak values and the plurality of bottom values.

2. The operation device as claimed in claim 1, further comprising:
a sound generating member that generates electronic sound; and
a sound controlling part that controls the sound generating member,
wherein the sound controlling part is controlled by the controller.

3. The operation device as claimed in claim 1 wherein the movable member is made of a soft magnetic material.

4. The operation device as claimed in claim 1,. wherein
the magnetic generating mechanism includes a second yoke disposed facing the movable member on an other side of the movable member, and
the gap between the movable member and the second yoke is filled with the magnetic viscous fluid.

5. A control method of an operation device including
an operation unit including, an operation body worked by a manipulation of an operator;
a position detecting part that detects a position of the manipulation where the operation body is located;
a display unit that displays an operation position of the operation body; and
a controller that controls the operation controlling part and the display controlling part,
wherein the operation unit includes
an operation member that includes an operation member manipulated by the operator and having the operation body,
a support body that freely supports the operation of the operation body, and
a movable load applying mechanism that applies a load to the operation body,
in which the operation body includes a movable shaft enabling the operation,
wherein the movable load applying mechanism includes
a movable member that operates in engagement with a movable shaft,
a magnetic generating mechanism that sandwiches the movable member and a gap, and faces one side thereof, and
a magnetic viscous fluid that exists in at least a part of the gap and whose viscosity changes according to a strength of a magnetic field,
wherein the magnetic generation mechanism includes
a coil that generates a magnetic field by energization by the operation controlling part,
a first yoke that is provided so as to surround the coil and is disposed on one side of the movable member, and
an operation controlling part that controls energization to the coil,
wherein the display unit includes
a display part that displays the operation position, and
a display controlling part that controls a display on the display part, the control method comprising:
forming a load curve having a plurality of peak values and a plurality of bottom values of the load depending on a strength of a current value to the coil by the operation controlling part, and
controlling, by the controller, the display controlling part to display, on the display part, a shift state of the operation position in a case of shilling from a first peak value to a first bottom value and from the first bottom value to a next second peak value among the plurality of peak values and the plurality of bottom values.

6. The control, method of the operation device as claimed in claim 5, wherein the controller causes the operation position to be displayed at a desired position on the display part in a case in which the operation body is located in a predetermined range including a bottom value of the load curve.

7. The control method of the operation device as claimed in claim 5, wherein the operation device further includes
a sound generating member that generates electronic sound, and
a sound controlling part that controls the sound generating member,
wherein the controller controls the sound controlling part to generate the electronic sound, in a case of shifting from a peak value to a bottom value and from the bottom value to a next peak value.

8. The control method of the operation device as claimed in claim 7, wherein the controller generates the electronic sound when the operation body is located in a predetermined range including the bottom value.

* * * * *